(12) United States Patent
Keehr et al.

(10) Patent No.: US 8,233,871 B2
(45) Date of Patent: Jul. 31, 2012

(54) INCOMPRESSIBLE RF RECEIVER

(75) Inventors: Edward Keehr, Pasadena, CA (US); Seyed Ali Hajimiri, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 139 days.

(21) Appl. No.: 12/817,109

(22) Filed: Jun. 16, 2010

(65) Prior Publication Data
US 2010/0316172 A1 Dec. 16, 2010

Related U.S. Application Data

(60) Provisional application No. 61/187,558, filed on Jun. 16, 2009, provisional application No. 61/302,292, filed on Feb. 8, 2010, provisional application No. 61/311,711, filed on Mar. 8, 2010, provisional application No. 61/320,845, filed on Apr. 5, 2010.

(51) Int. Cl.
*H04B 1/18* (2006.01)
*H04K 3/00* (2006.01)
(52) U.S. Cl. .................. 455/285; 455/302; 330/124 R
(58) Field of Classification Search ............. 455/285, 455/295–296, 302, 341; 330/124 R, 299
See application file for complete search history.

(56) References Cited

U.S. PATENT DOCUMENTS 3,231,819 A * 1/1966 Aaron .......................... 455/42
3,825,843 A * 7/1974 Felsberg et al. ............. 327/317

* cited by examiner

*Primary Examiner* — Lee Nguyen
(74) *Attorney, Agent, or Firm* — Milstein Zhang & Wu LLC; Joseph B. Milstein

(57) ABSTRACT

An incompressible receiver for minimizing undesired higher-order nonlinear distortion products includes a first receiver path configured to receive an input signal having at least one non-baseband frequency. A second receiver path is also configured to receive the input signal. The second receiver path includes at least one odd-order nonlinear distortion reference component and at least one even-order nonlinear distortion reference component. The distortion reference components are configured to be in an "on" state or in an "off" state. A combining element is configured to combine input signals from the first and second receiver paths such that the higher-order nonlinear distortion signals are substantially attenuated at an output of the combining element. An incompressible receiver that has an odd-order nonlinear distortion reference generator including a cubic term and at least one additional term of order greater than 3 and an incompressible receiver front end amplifier (IRFEA) are also described.

24 Claims, 36 Drawing Sheets

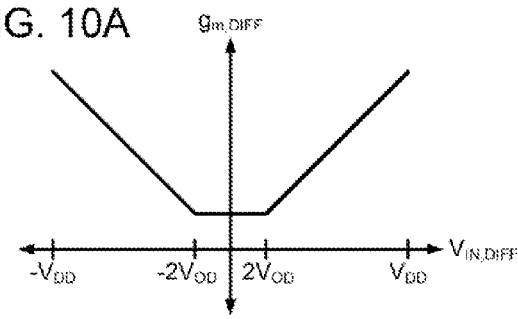
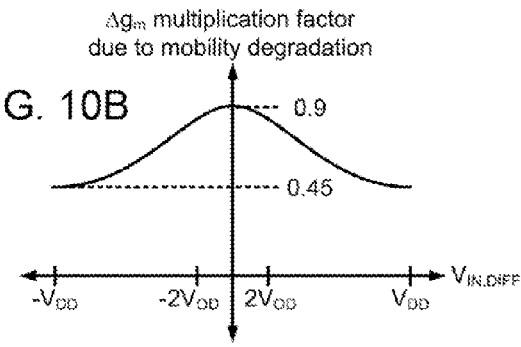
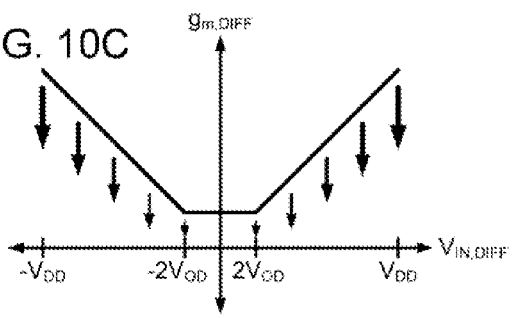
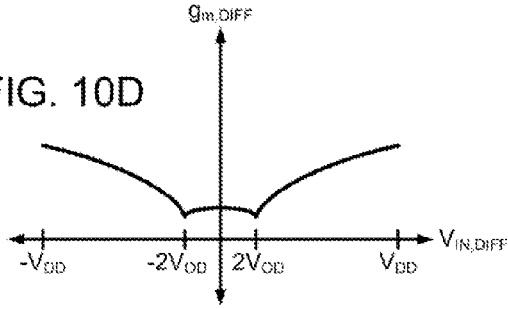
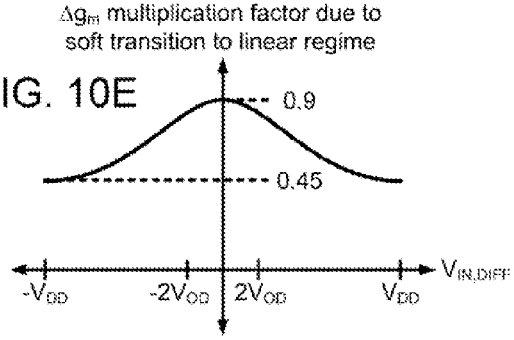
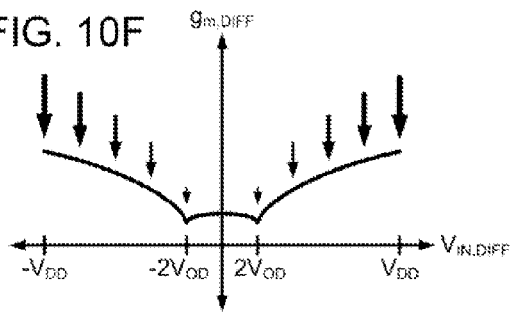
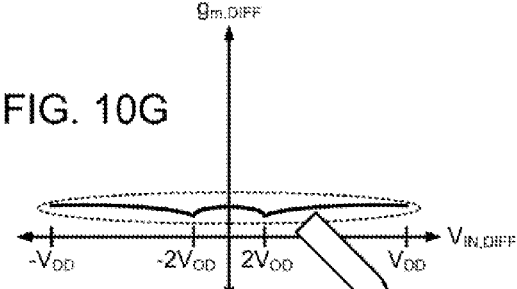
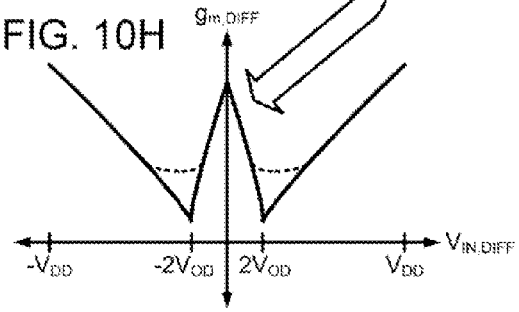

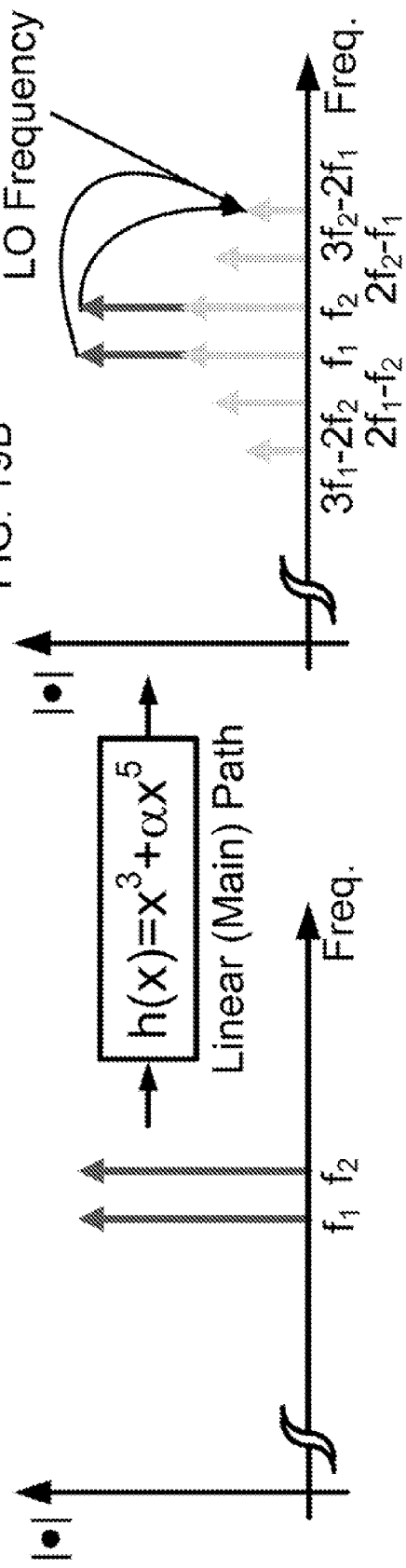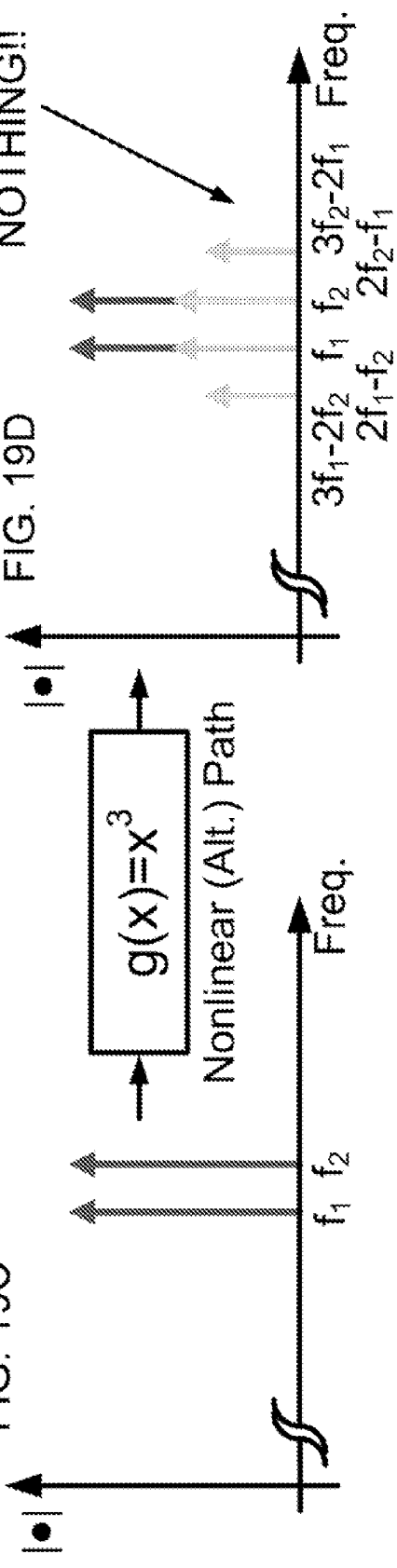

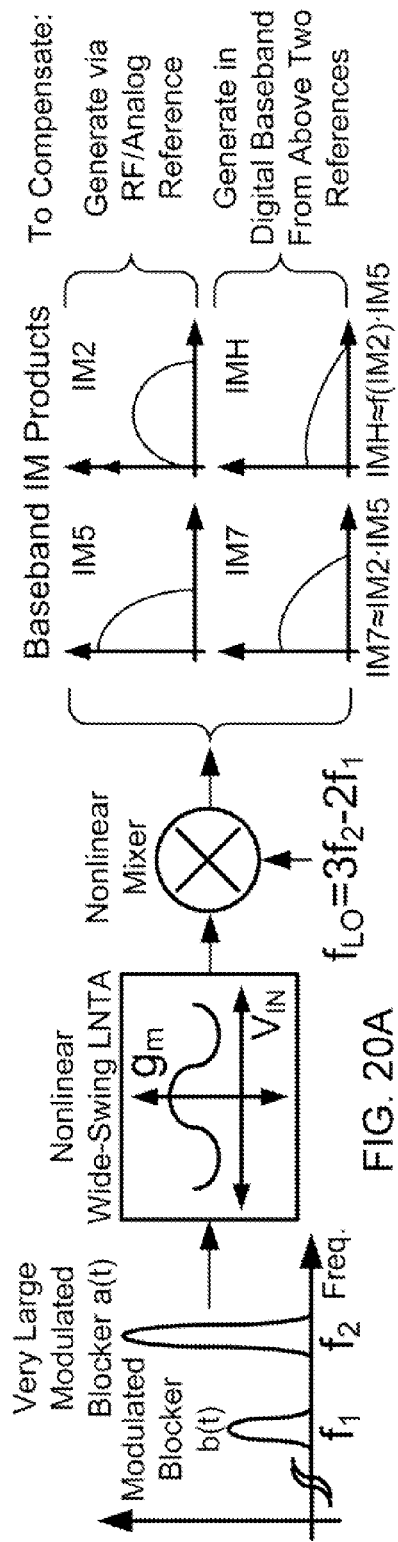
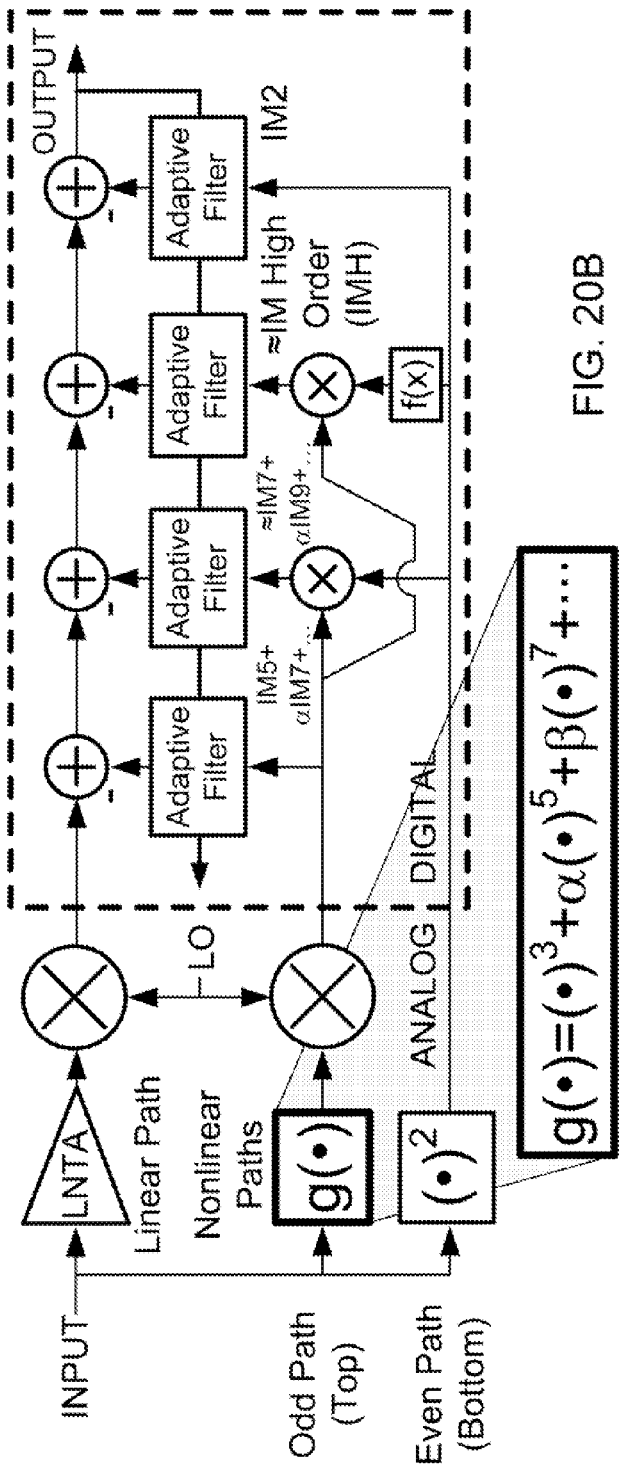
FIG. 20A
FIG. 20B

| Measurement at $f_{LO}$=1.9GHz | Result |
|---|---|
| RF/Analog Die Area | (2.8mm)^2 |
| RF/Analog Die External Supply | 1.5V |
| RF/Analog Die Process | 90nm CMOS |
| Receiver Linear Path Voltage Gain | 50.3dB |
| Sim. DC Gain of Lin. Path Biquad | 20.0dB |
| Receiver Linear Path Noise Figure | 10.7dB |
| Peak Effective Two-Tone IIP3 (Uncorrected) @1.81GHz/1.72GHz | +33.5dBm |
| Two-Tone IIP2 (Uncorrected) @ 1.81GHz | +64dBm |
| Return Loss (S11) 1.6GHz-2.0GHz | <-16dB |
| 1-dB Desensitization @1.81GHz | +12.5dBm |
| Linear Path Quiescent Current | 14mA |
| On-chip LO Generation Current | 46.2mA |
| Even/Odd Path Quiescent Current | 3.5/14.3mA |
| Total RF/Ana. Die Quies. Current | 84.8mA |
| Baseband Signal Meas. Bandwidth | 0.01-1.92MHz |

FIG. 32

INCOMPRESSIBLE RF RECEIVER

CROSS-REFERENCE TO RELATED APPLICATIONS

This application claims priority to and the benefit of co-pending U.S. provisional patent application Ser. No. 61/187,558, Incompressible RF Receiver, filed Jun. 16, 2009, U.S. provisional patent application Ser. No. 61/302,292, Successive Regeneration and Adaptive Feedforward Cancellation of Intermodulation Products Accounting for High-Order Polynomial Functions, filed Feb. 8, 2010, U.S. provisional patent application Ser. No. 61/311,711, Successive Regeneration and Adaptive Feedforward Cancellation of Intermodulation Products Accounting for High-Order Polynomial Functions, filed Mar. 8, 2010, and U.S. provisional patent application Ser. No. 61/320,845, Successive Regeneration and Adaptive Feedforward Cancellation of Intermodulation Products Accounting for High-Order Polynomial Functions, filed Apr. 5, 2010, which applications are incorporated herein by reference in their entirety for all purposes. Related applications include U.S. patent application Ser. No. 11/751,363, "DIGITAL AND ANALOG IM3 PRODUCT COMPENSATION CIRCUITS FOR AN RF RECEIVER", filed May 21, 2007 which described circuits and a method of attenuating third harmonic interference (IM3) products in a down-converted and digitized RF signals, U.S. patent application Ser. No. 12/233,314, "EQUALIZATION OF THIRD-ORDER INTERMODULATION PRODUCTS IN WIDEBAND DIRECT CONVERSION RECEIVER", filed Sep. 18, 2008 which described a feedforward error-compensated receiver for minimizing undesired odd-order nonlinear distortion products, and U.S. patent application Ser. No. 12/687,113, "SPLIT ANALOG/DIGITAL POLYNOMIAL NONLINEAR TERM GENERATOR WITH REDUCED NUMBER OF ANALOG-TO-DIGITAL CONVERTERS", filed Jan. 13, 2010 which described another polynomial nonlinear term generator for use in dual path receivers, all of which applications are incorporated herein by reference in their entirety for all purposes.

STATEMENT REGARDING FEDERALLY FUNDED RESEARCH OR DEVELOPMENT

The U.S. Government has certain rights in this invention pursuant to Grant No. FA8650-09-C-7924 awarded by Air Force Office of Scientific Research.

FIELD OF THE INVENTION

The invention relates to a radio receiver in general and particularly to an incompressible radio receiver.

BACKGROUND OF THE INVENTION

Radio receivers are typically designed to receive electromagnetic signals in the radio frequency (RF) portion of the electromagnetic spectrum. Generally a desired radio signal is intercepted by a radio antenna and propagated along with other undesired signals to electronic circuits within the radio. Additional undesired radio signals, including for example intermodulation (IM) products are created by interactions of both desired and undesired radio signals from both the antenna and within the radio. The undesired signals (e.g. a blocker signal at some frequency offset from the desired signal) can be relatively strong compared to the signal strength of the desired signal. Receivers of the prior art can be overwhelmed by such blocker signals and as a consequence can fail to properly receive and/or fail to properly process (e.g. demodulate) a desired signal.

There exist well known metrics in the radio industry which can be used to judge receiver performance in the presence of unwanted interfering signals. For example input saturation affects can be described by the input gain compression point (ICP1) measurement or specification. Intermodulation effects are described in part by a third input intercept point (IIP3) measurement or specification. While such measurements as the ICP1 and IIP3 parameters describe in part conditions under which a radio continues to operate properly, there has been little success in designing a radio receiver that can work in the presence of large blacker signals whose voltage magnitude is on the order of that of the circuit voltage supply rail.

What is needed, therefore, is a radio receiver circuit topology which enables a radio receiver to correctly receive and process a desired radio signal in the presence of one or more interfering signals.

SUMMARY OF THE INVENTION

In one aspect, the invention relates to an incompressible receiver for minimizing undesired higher-order nonlinear distortion products which includes a first receiver path having a first receiver path input configured to receive an input signal having at least one non-baseband frequency. At least one first receiver path output is configured to provide a first path output signal having at least one baseband (BB) frequency. The first receiver path includes at least one mixer. The at least one mixer has a first input terminal electrically coupled to a local oscillator which is configured to provide a local oscillator signal and has a second input terminal electrically coupled to the first path input and has a mixer output terminal electrically coupled to the at least one first receiver path output. The mixer is configured to perform a frequency conversion. The first receiver path output signal includes a higher-order nonlinear distortion component. At least a second receiver path has a second receiver path input configured to receive an input signal having at least one non-baseband frequency, and a second receiver path output terminal configured to provide a second receiver path output signal. The second receiver path includes at least one odd-order nonlinear distortion reference component and at least one even-order nonlinear distortion reference component. Each of the at least one odd-order nonlinear distortion reference component and at least one even-order nonlinear distortion reference component is configured to be in an "on" state or in an "off" state independent of any other of the at least one odd-order nonlinear distortion reference component and the at least one even-order nonlinear distortion reference component. At least one mixer is configured to combine an even-order reference signal and an odd order reference signal as the second receiver path output signal. A combining element is configured to receive as input the output signal from the first receiver path output terminal and is configured to receive as input the output signal from the second receiver path output terminal and is configured to combine the input signals such that the higher-order nonlinear distortion signals are substantially attenuated at an output of the combining element.

In one embodiment, the at least one odd-order nonlinear distortion reference component of the second receiver path includes a mixer having a first input electrically coupled to an odd-order nonlinear distortion reference generator and a second input electrically coupled to the local oscillator and an output of the mixer electrically coupled to an input terminal of an odd-order function block. The odd-order nonlinear distortion reference generator has as input the second receiver path input and an output of the odd-order nonlinear distortion reference component is electrically coupled to the combining element.

In another embodiment, the at least one even-order nonlinear distortion reference component of the second receiver path includes an even-order nonlinear distortion reference which is electrically coupled to an input terminal of an even-order function block. The even-order nonlinear distortion reference generator has as input the second receiver path input and an output of the even-order nonlinear distortion reference component is electrically coupled to the combining element.

In yet another embodiment, the incompressible receiver further includes within the second receiver path at least one adaptive filter disposed between at least one of a selected one of an even order correction signal and an odd order correction signal and the second receiver path output.

In yet another embodiment, the odd-order nonlinear distortion reference generator includes both a cubic term and at least one additional term of order greater than 3.

In yet another embodiment, the incompressible receiver further includes a low noise transconductance amplifier (LNTA) disposed between the input signal and a common signal path coupled to the first receiver path input and the second receiver path input.

In yet another embodiment, at least one of a selected one of the even-order function block and the odd-order function block includes a look-up table.

In yet another embodiment, the at least one of a selected one of the even-order function block and the-odd order function block includes a mathematical function.

In yet another embodiment, the mathematical function includes a software algorithm configured to perform the mathematical function when operating on a computation device.

In yet another embodiment, the mathematical function includes a digital circuit configured to perform the mathematical function.

In yet another embodiment, the incompressible receiver includes a monolithic integrated circuit.

In yet another embodiment, the monolithic integrated circuit includes a CMOS monolithic integrated circuit.

In yet another embodiment, the incompressible receiver includes a component in a frequency division duplex (FDD) receiver-transmitter.

In yet another embodiment, the incompressible receiver includes a component in an apparatus having wireless power transfer.

In yet another embodiment, the incompressible receiver includes a component of a countermeasures apparatus.

In yet another embodiment, the incompressible receiver further includes an adaptive filter disposed between the higher-order term mixer and the combining element.

In yet another embodiment, the incompressible receiver further includes a complex LMS algorithm modified to compensate for I/Q mismatch.

In yet another embodiment, the incompressible receiver further includes a complex modified-NLMS algorithm modified to compensate for I/Q mismatch.

In yet another embodiment, a selected one of the even path function block and the odd path function block includes a function of the form $e^{-|k|x}$.

In yet another embodiment, the even path function block includes a function of the form $\tan h(k \cdot x)$.

In yet another embodiment, a selected one of the even path function block and the odd path function block includes a discrete time function.

In another aspect, the invention relates to an incompressible receiver for minimizing undesired odd-order nonlinear distortion products that includes a first receiver path that has a first path input configured to receive an input signal having at least one non-baseband frequency, and at least one first receiver path output configured to provide a first receiver path output signal having at least one baseband (BB) frequency. The first receiver path includes at least one mixer. The at least one mixer has a first input terminal electrically coupled to a local oscillator and is configured to provide a local oscillator signal and has a second input terminal electrically coupled to the first receiver path input and also has a mixer output terminal electrically coupled to the at least one first receiver path output. The mixer is configured to perform a frequency conversion. The first receiver path output signal includes an odd-order nonlinear distortion component. At least one second receiver path has a second receiver path input configured to receive an input signal having at least one non-baseband frequency, and a second receiver path output terminal configured to provide a second receiver path output signal. The second receiver path includes at least one odd-order nonlinear distortion reference generator that has an output terminal. The odd-order nonlinear distortion reference generator includes a cubic term and at least one additional term of order greater than 3. The second receiver path includes at least one mixer. Each of the at least one mixer has a first input terminal electrically coupled to a local oscillator and is configured to provide a local oscillator signal and has a second input terminal electrically coupled to the at least one odd-order nonlinear distortion reference generator output terminal and has a mixer output terminal electrically coupled to the at least one second receiver path output. The at least one odd-order nonlinear distortion reference generator and the mixer are configured to generate a synthetic odd-order nonlinear distortion signal as output that is substantially similar to the odd-order nonlinear distortion component that appears at the first receiver path output terminal. A combining element is configured to receive the output signal from the first receiver path output terminal and is configured to receive the output signal from the second receiver path output terminal and is configured to combine the input signals such that the odd-order nonlinear distortion signals are substantially attenuated at an output of the combining element.

In yet another aspect, the invention relates to an incompressible receiver front end amplifier (IRFEA) that includes a positive array of inverters having a positive array positive input terminal and a positive array positive output terminal, each inverter of the array of inverters having a different threshold voltage. A negative array of inverters has a negative array positive input terminal and a positive output terminal. Each inverter of the array of inverters has a different threshold voltage. A LNTA has a LNTA positive input terminal, a LNTA negative input terminal, a LNTA positive output terminal, and a LNTA negative output terminal. The LNTA positive input terminal is electrically coupled to the positive array positive input terminal at a IRFEA positive input terminal. The LNTA negative input terminal is electrically coupled to the negative array positive input terminal at a IRFEA negative input terminal. The LNTA positive output terminal electrically coupled to the positive array positive output terminal at a IRFEA positive output terminal, and the LNTA negative output terminal electrically coupled to the negative array positive output terminal at a IRFEA negative output terminal.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

FIG. 10A to FIG. 10H show an illustration of a transconductance W-shape of the LNTA of FIG. 9.

FIG. 19A to FIG. 19D are graphs in the frequency domain which show an insufficiency of a pure cubic basis for an odd-order nonlinear reference in the presence of higher-order terms in the nominally linear path.

FIG. 20A shows a conceptual representation of a successive regeneration and adaptive feedforward cancellation of intermodulation products technique that includes higher-order terms present in the odd-order nonlinear term generator.

FIG. 20B shows a simplified system block diagram of a receiver architecture which performs the conceptual method of FIG. 20A.

FIG. 32 shows a table of baseline receiver performance metrics.

DETAILED DESCRIPTION

As described hereinbelow, we believe that is possible to operate a receiver in the large-signal regime in which the higher-order intermodulation distortion terms are non-negligible with respect to the thermal noise floor and with respect to second- and third-order intermodulation distortion terms. In such an "explicitly nonlinear system," the large-signal regime describes a situation in which a receiver attempts to correctly demodulate the desired signal in the presence of much larger out-of-band undesired signals.

Figure 1:
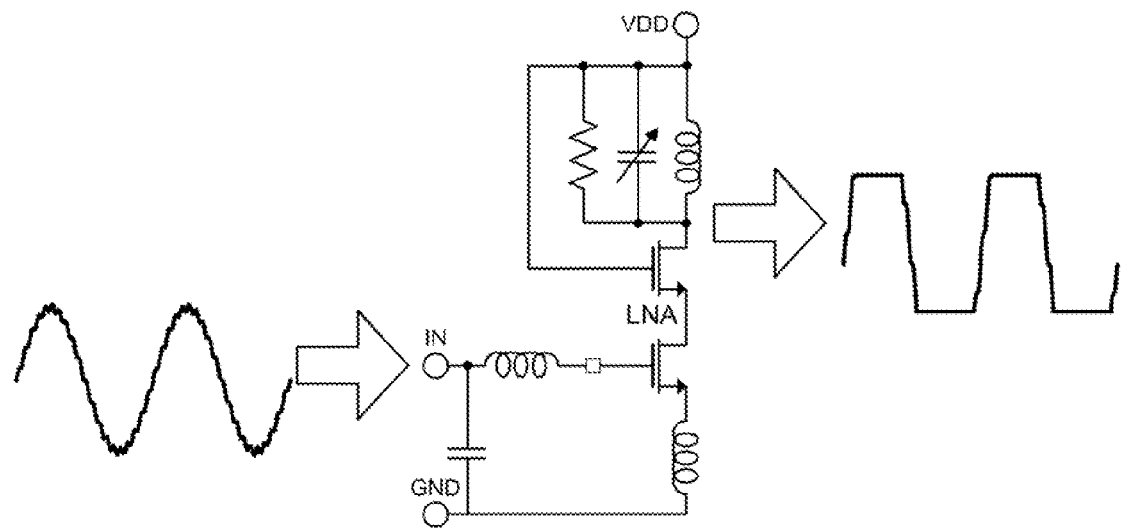
FIG. 1 shows a schematic diagram of a low noise (LNA) amplifier.

One of the problems associated with operating circuits in the large-signal regime is compression (desensitization). As illustrated by the circuit of FIG. 1, small signal gain is significantly reduced in the presence of the large out-of-band undesired signals. As supply voltages drop and blockers increase, voltage domain circuits are susceptible to compression. The problem is not only one of distortions per se, but also that reduced gain suppresses a desired signal. Once this small signal gain is reduced, the signal-to-noise ratio applicable to the desired signal is significantly reduced as well.

Multidimensional Inverter Arrays (MDIA)

Figure 2:
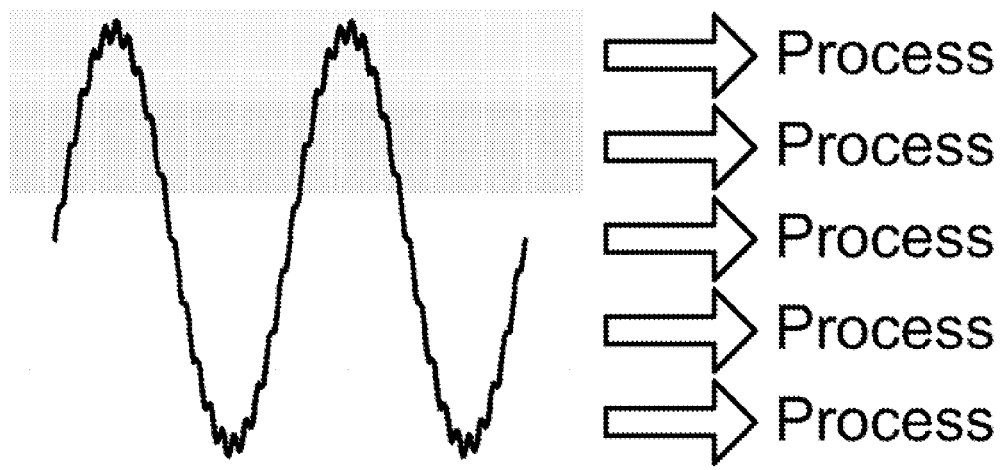
FIG. 2 shows a diagram which illustrates a technique of breaking up a compression problem into multiple spatial dimensions.

One approach to solving this problem is to break up the incoming signal into multiple sub-signals and to process each of these independently, summing the results of the processing at a convenient point. As shown in FIG. 2, this approach breaks up the compression problem into multiple special dimensions. The signal is divided up in the voltage domain, and then each part can be separately processed. This concept is known in the art as piecewise linearization.

Figure 3A:
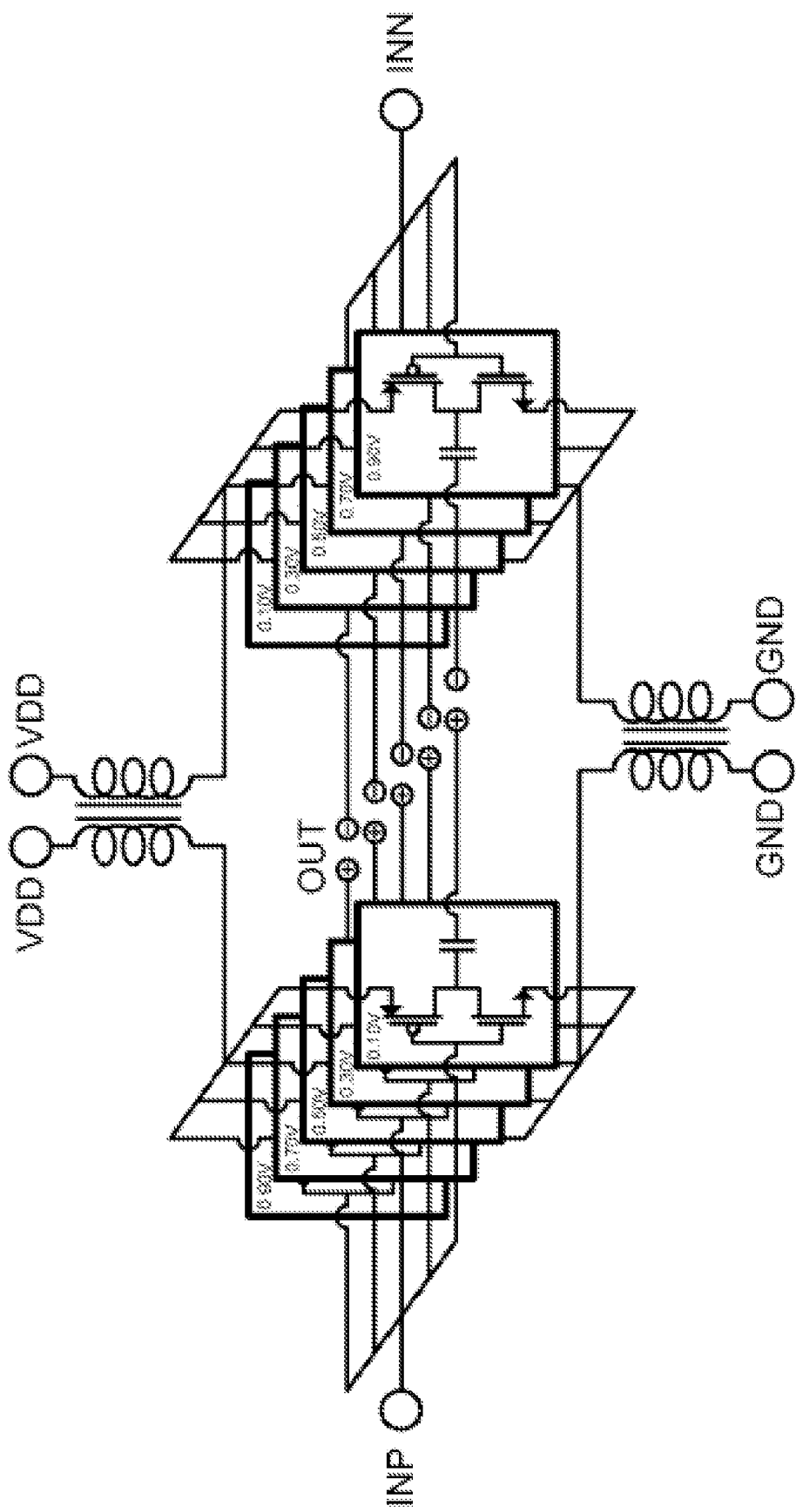
FIG. 3A shows a schematic diagram of one exemplary embodiment of a multidimensional inverter array (MDIA).

As illustrated by the schematic diagram of FIG. 3A, one way to implement a piecewise-linear RF amplifier is to build an array of inverters that function as common-source amplifiers. The composite structure, a multidimensional inverter array (MDIA), functions as a low-noise transconductance amplifier (LNTA). The piecewise-linear nature of the structure is provided by assigning a different threshold voltage to each of the inverters. Assigning a different threshold voltage to each of the inverters can be accomplished in two ways. The first method is to alter the relative sizes of the NMOS and PMOS devices in each inverter appropriately. The second method is to AC-bias each of the inverters at a different voltage. For example, the terminals "INP" and "INN" could couple to each of the inverter gates via a capacitor. Each of the DC offset voltages would then be coupled to one of the inverter gates via a resistor. In the exemplary circuit of FIG. 3A, a large blocker signal only enables one inverter at a time (per half), thus saving current in such a MDIA. An inductor can be present in order to inductively degenerate the common-source amplifiers such that a 50Ω load can be presented to the driving RF source of the circuit.

Figure 3B:
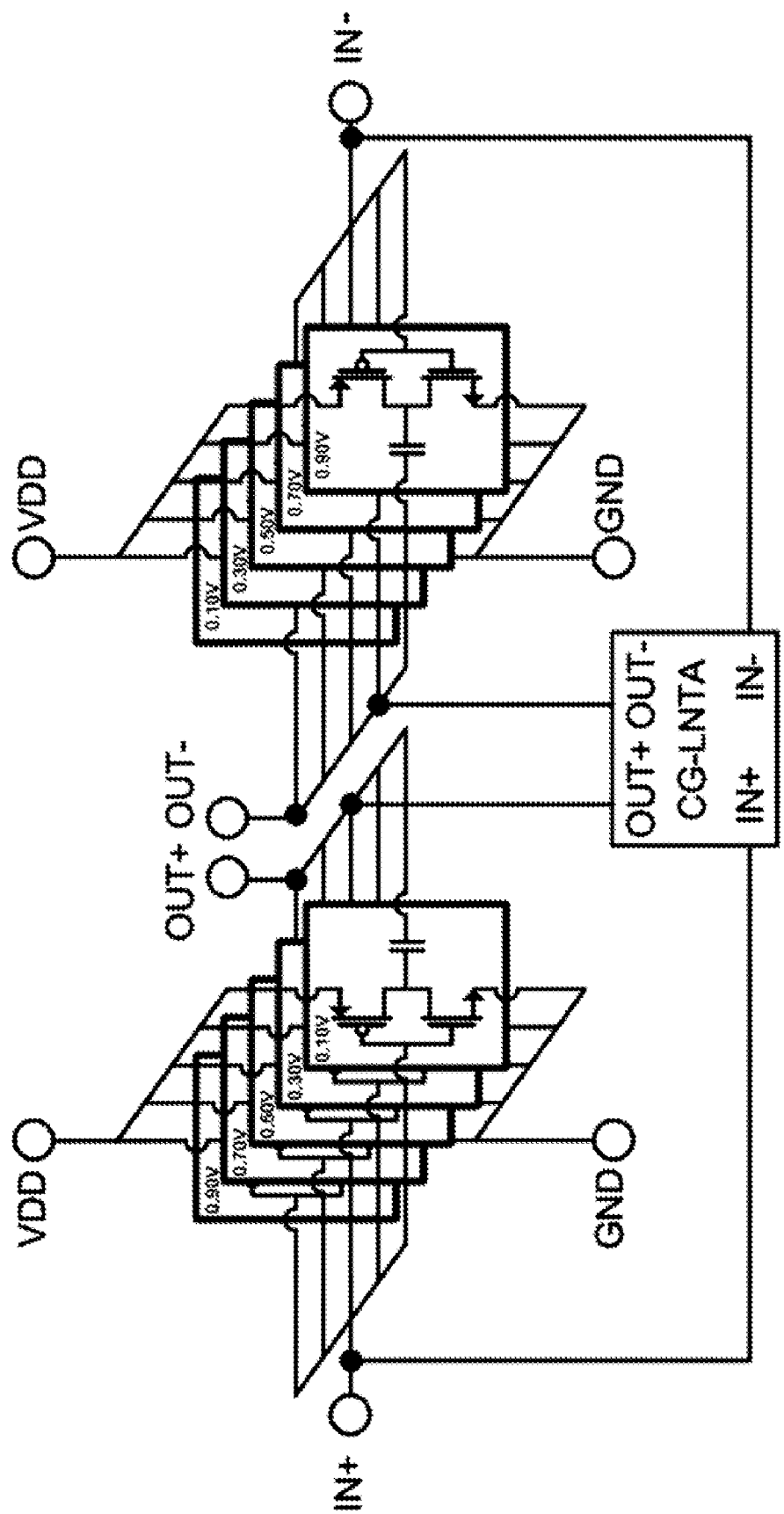
FIG. 3B shows a schematic diagram of another embodiment of an MDIA which does not use inductors.

Another option to achieve a 50Ω load match (FIG. 3B) is to dispense with the inductors, tying the source terminals of the NMOS and PMOS devices to GND and VDD respectively. The resulting structure can then be placed in parallel with the push-pull class-AB LNTA which would provide the 50Ω load match to the driving source impedance over substantially the entire input voltage range.

Figure 4:
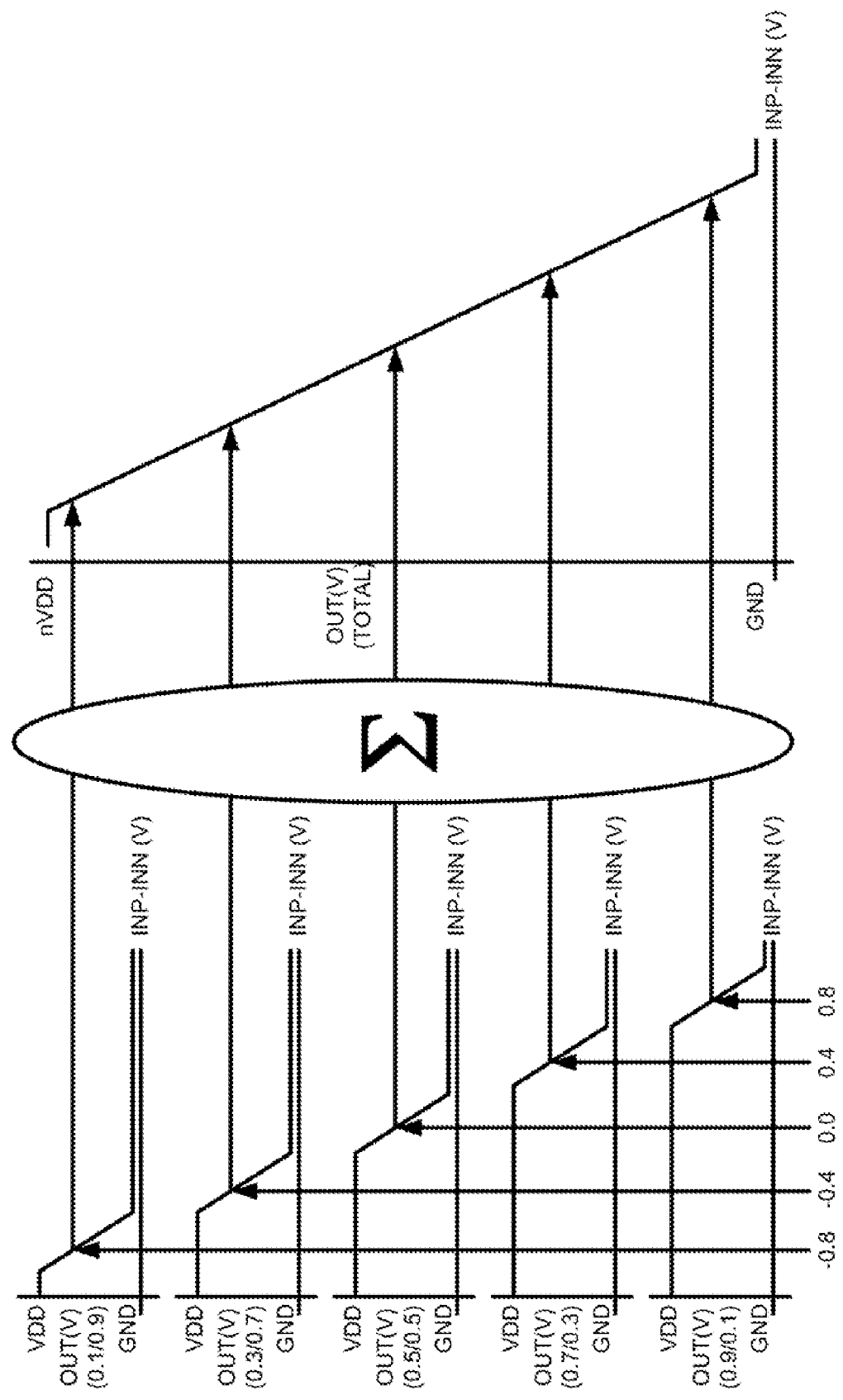
FIG. 4 shows a conceptual operation drawing of the piecewise-linear method.

FIG. 4 shows a conceptual operation drawing of the piecewise-linear method. In this case each of the inverters is linear, but only over a small range. By offsetting each range by a fixed voltage for each unit inverter and then placing many of these inverters in parallel, a composite linear structure can be obtained.

Figure 5:
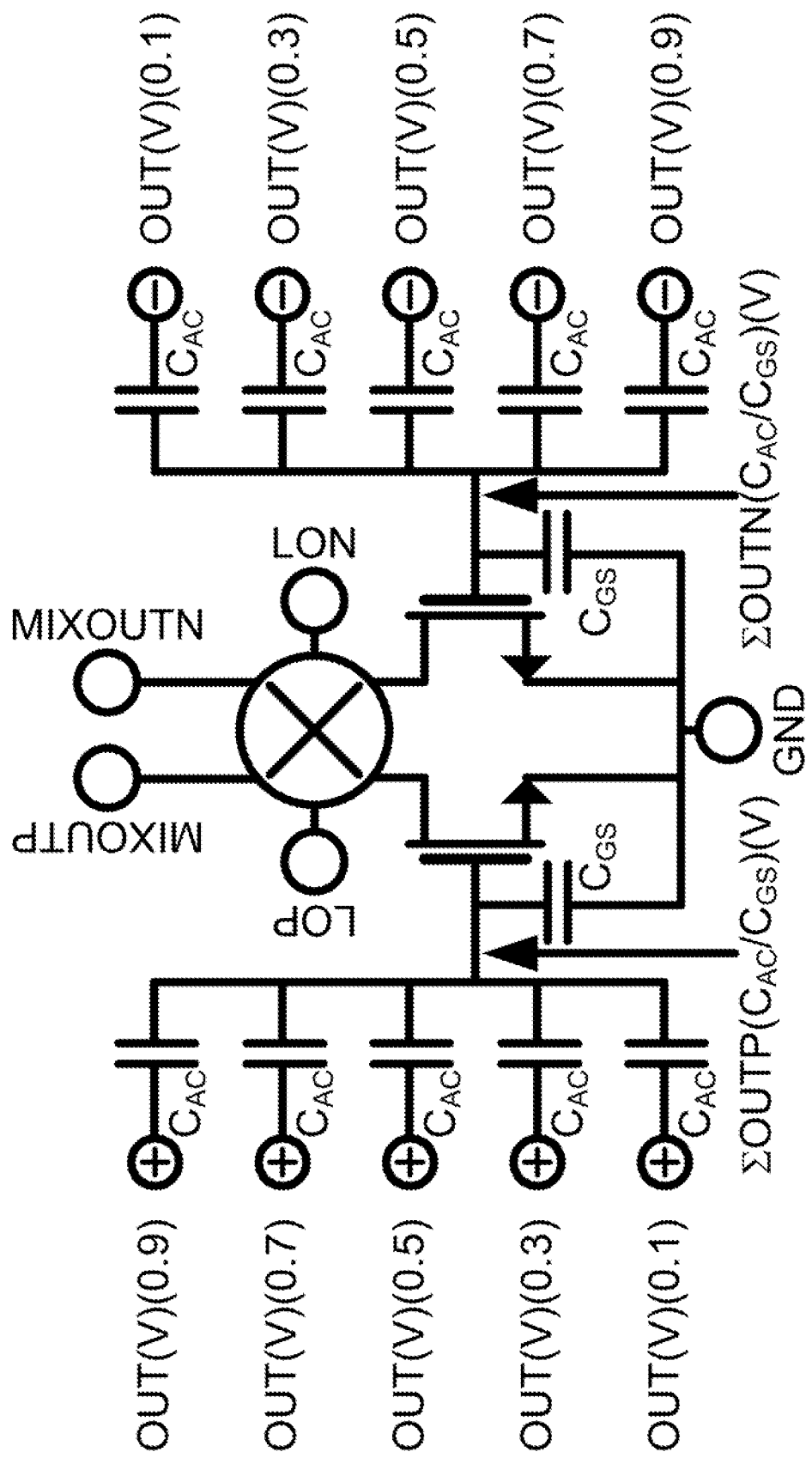
FIG. 5 a schematic diagram representation of one exemplary summation strategy.

FIG. 5 shows a schematic diagram representation of a summation strategy. Such a structure can be used to add outputs immediately after an MDIA. In order to sum all of the currents from each of the inverters, the currents can be developed as a voltage on the gates of transistors acting as the transconductors to a Gilbert mixer cell circuit. The problem here is that the resultant voltage would be larger than that seen at the input of the receiver provided that the combination of the LNTA and the capacitors on the gates of the transistors yields a useful gain. In this case, however, the Gilbert mixer cell circuit would operate deep in the desensitization regime in which the small signal gain has been substantially reduced.

Figure 6:
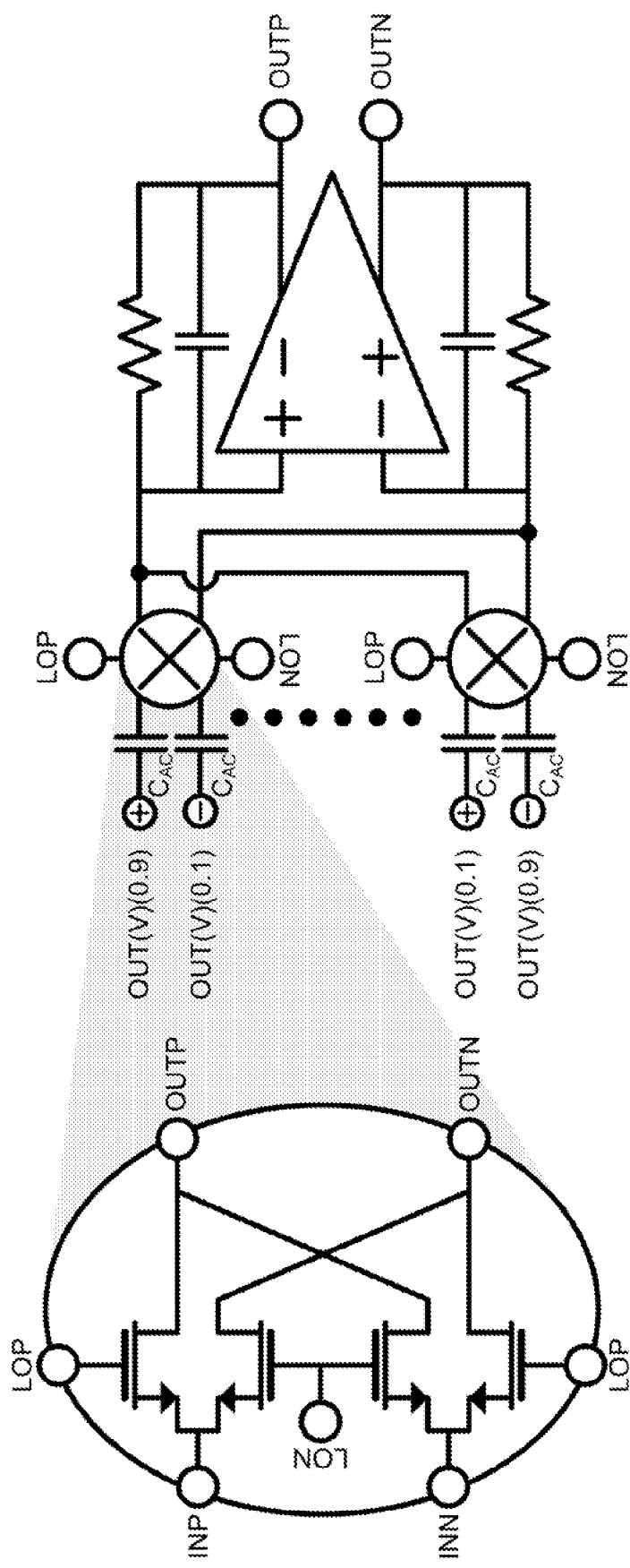
FIG. 6 shows a schematic representation of another exemplary summation strategy.

FIG. 6 shows a schematic representation of another summation strategy. In the circuit topology of FIG. 6, a passive mixer architecture is used for each inverter output. In this case there is no current-to-voltage conversion prior to frequency downconversion and in principle an unlimited amount of current can be passed through the passive mixer. The portion of the current comprised of the large undesired out-of-band signals can then be relatively easily filtered at baseband in the current-to-voltage conversion process.

In other embodiments, a separate mixer is not used for each inverter output. Since the current from each inverter is an AC current, each positive inverter output can be capacitively coupled to the others while each negative inverter output can be capacitively coupled to the others. The resultant differential signal can then be downconverted via a single passive mixer.

Figure 7:
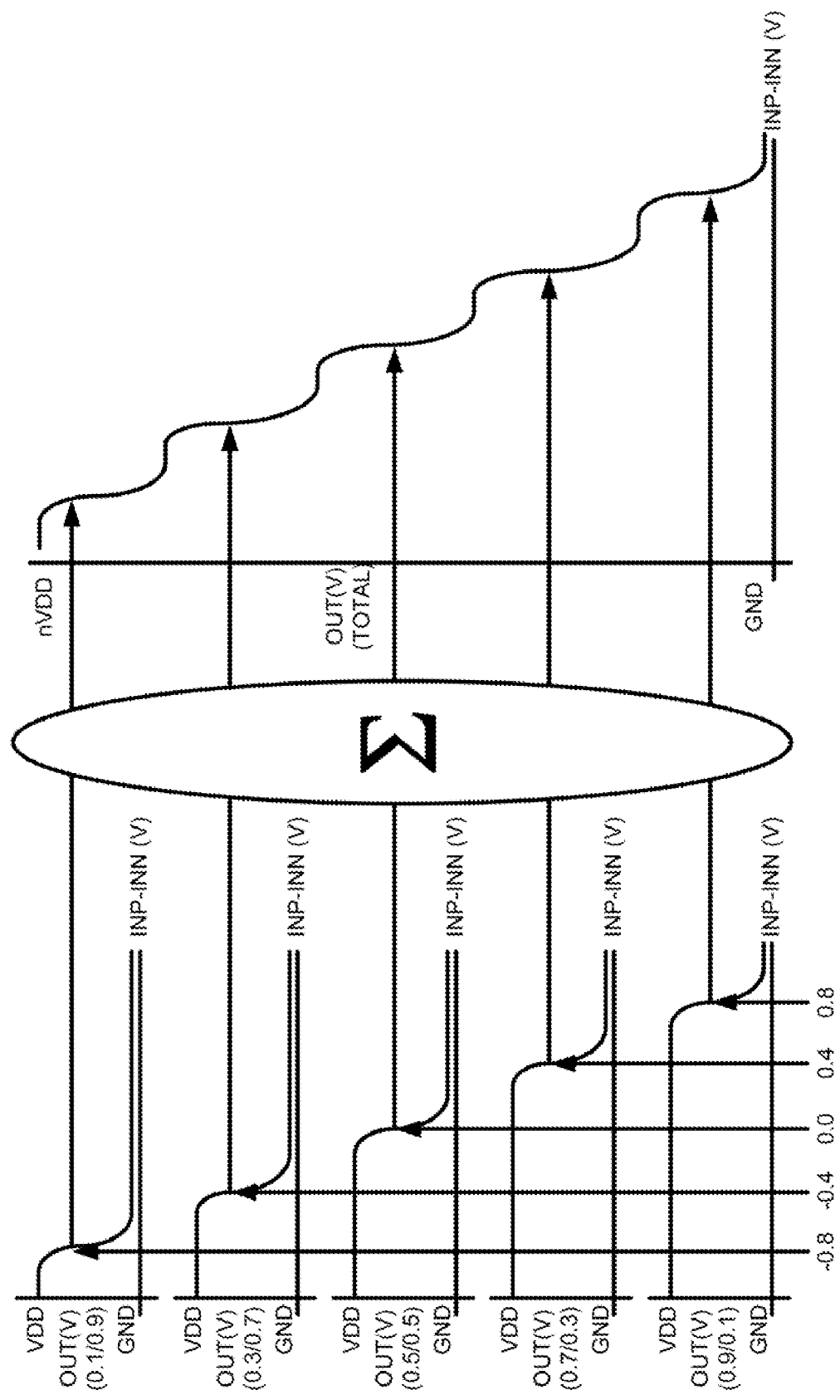
FIG. 7 shows a graph illustrating MDIA distortion effects.

Referring back to FIG. 4, the piecewise-linear concept can not produce a completely linear input-output characteristic when each of the composite devices is non-ideal. In this case, the resultant transfer characteristic is approximately linear, but has a non-monotonic nonlinear residual after the linear best fit is removed. In order to cancel intermodulation distortion interference arising from the interaction of large undesired signals with this nonlinear residual, many high order polynomial terms of intermodulation distortion cancellation can be applied. FIG. 7 shows a graph which illustrates MDIA distortion effects. The effective baseband transfer function can be highly nonlinear. Also, the inverter characteristics can vary in a low-dimension process.

Figure 8:
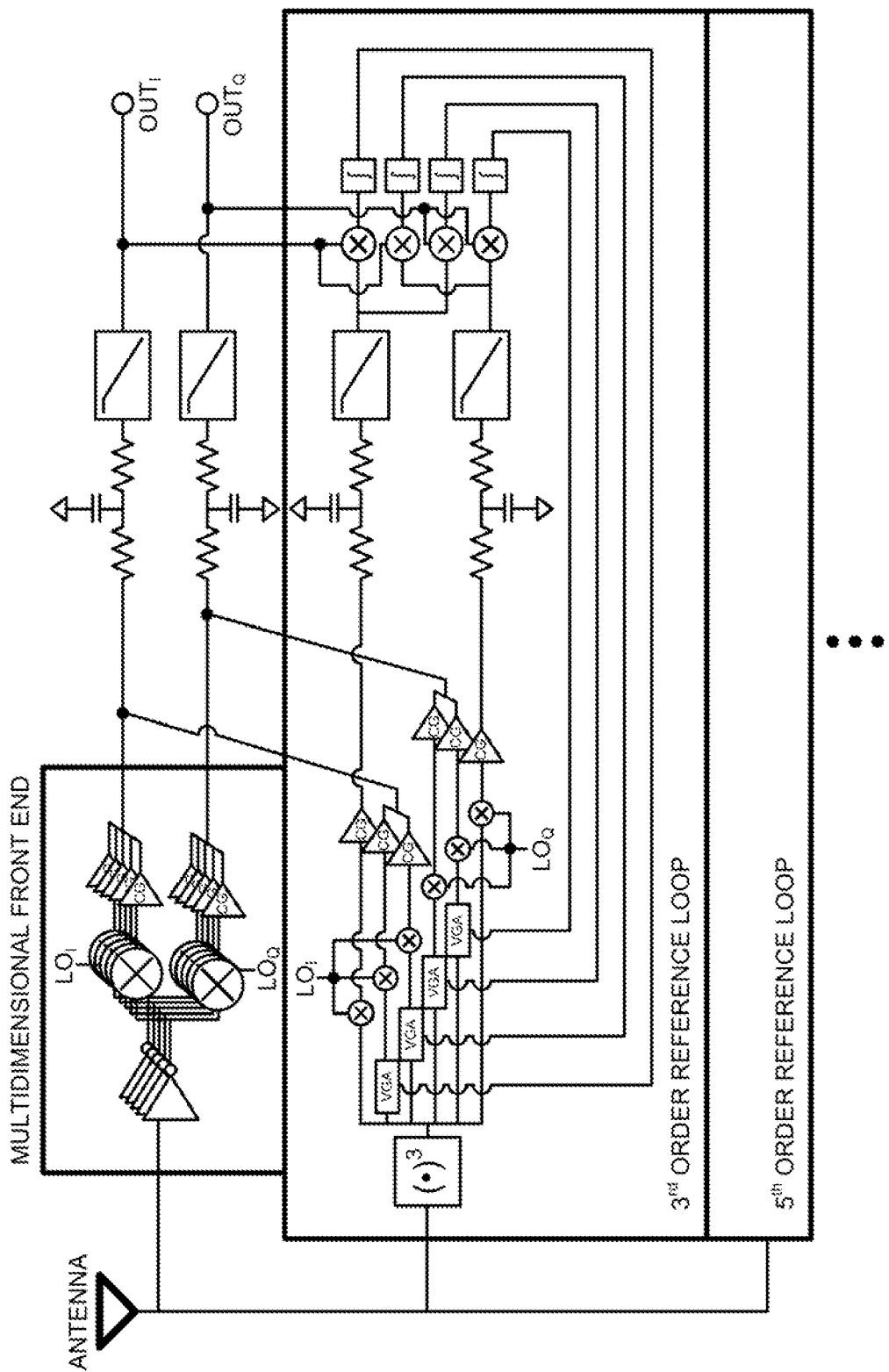
FIG. 8 shows a block diagram of one exemplary receiver architecture using a MDIA front end.

FIG. 8 shows a block diagram of one exemplary receiver architecture using an MDIA front end. In this architecture, higher-order intermodulation terms are cancelled in the analog domain. The main quadrature receiver path is shown on the top while nonlinear alternate receiver paths are shown below. In this case, one passive mixer is used for each input inverter, although this need not be the case. Prior to current-to-voltage conversion in the main path transimpedance amplifier (TIA), the downconverted current is partially filtered by an R-C-R structure.

In order to reduce the number of analog-to-digital converters used in this scheme, the adaptive filtering loops are applied in the analog domain. In this case, the correlation between each intermodulation distortion (I, Q) reference and each main path (I, Q) signal is performed at baseband and integrated. The result of this integration, as in LMS, represents a variable-gain weighting. In this case, this weighting is used to alter the gain of a variable-gain-amplifier (VGA) at RF following the IM3 term generator. The VGAs are placed at RF and perform a current-to-voltage conversion, so that the resultant IM3 products can be downconverted with passive mixers, buffered with common gate (CG) buffers, and then used to cancel IM3 products in the main path prior to current-to-voltage conversion. Doing so minimizes the needed dynamic range of the main path, which processes large intermodulation distortion interference along with the desired signal. Similar loops can be instituted for each of the higher-order polynomial terms and placed in parallel with the third-order intermodulation distortion cancellation loop.

Low-Noise Transconductance Amplifier (LNTA)

Figure 9:
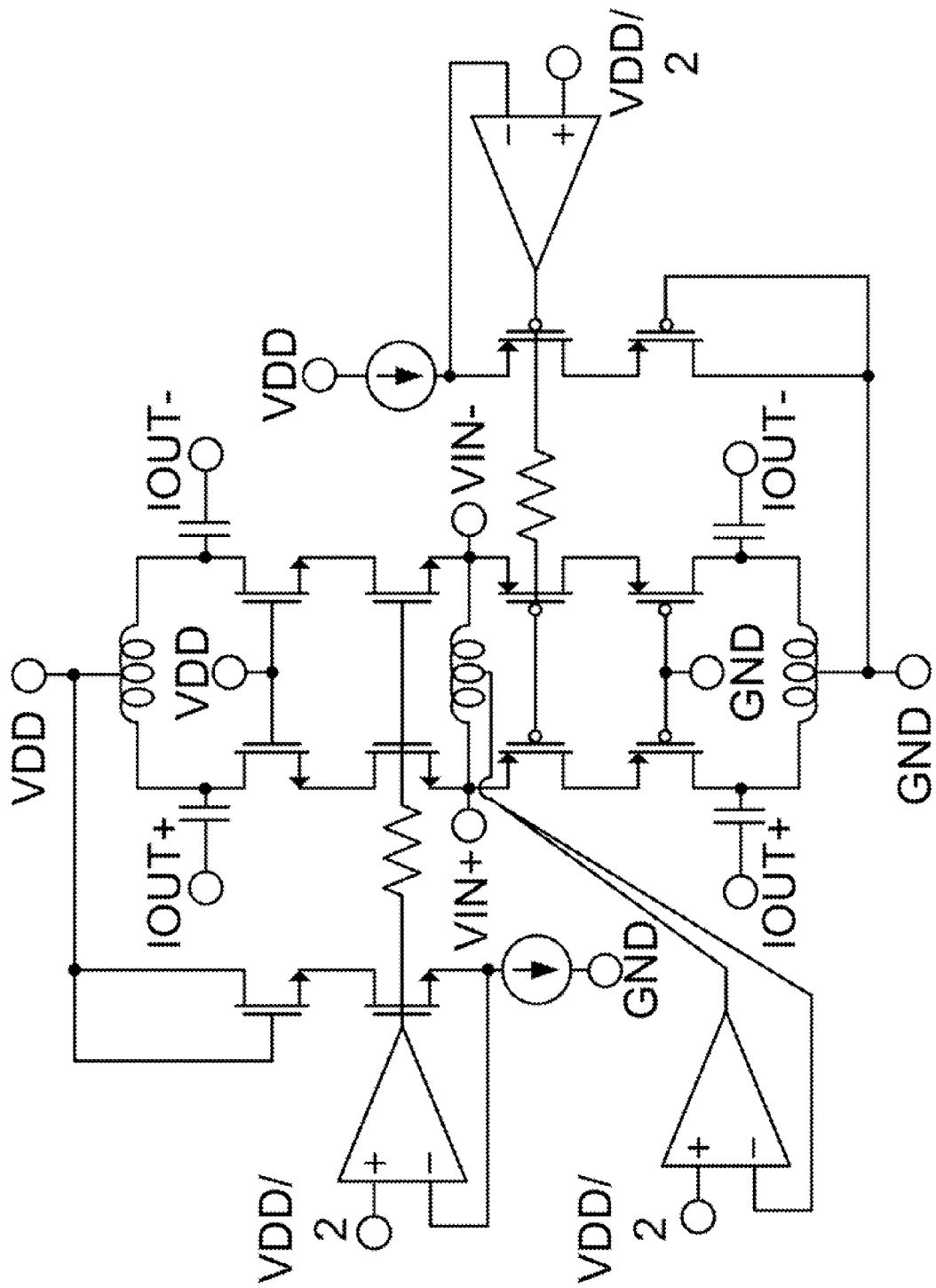
FIG. 9 shows a simplified schematic diagram of one exemplary low-noise transconductance amplifier (LNTA).

In order to realize an incompressible rail-to-rail input receiver, a stacked push-pull common-gate low-noise transconductance amplifier (LNTA) was designed using low-threshold voltage devices in a 90-nm RF CMOS process. Shown using a simplified schematic in FIG. 9, the core structure is comprised of both NMOS and PMOS cascoded common gate amplifiers. The common gate amplifiers are cascoded in order to provide isolation between the LNTA input and the passive mixers which follow the LNTA. The gate voltages of the input devices are defined with replica bias loops that ensure that the quiescent current flowing through the structure is proportional to the input bias current. The source voltages of the input devices are defined at VDD/2 by an OTA with a class-AB architecture via the differential input inductor which is used to perform RF bandpass tuning of the input.

The class-AB OTA architecture is related to asymmetry between the NMOS and PMOS device operation when the LNTA is subject to a large input signal. This asymmetry arises from the different mobility degradation effects inherent to NMOS and PMOS devices. Because this asymmetry exists, the large-signal current conducted by the PMOS device is slightly larger than that of the NMOS device. Because this current is rectified due to the individual half-cycle operation of the NMOS and PMOS devices, it is frequency-translated down to near-DC frequencies as IM2 products. This near-DC current can be advantageously sourced at the center node by a class-AB OTA or op-amp. The OTA or op-amp is configured to have class-AB operation so that the total current drawn by the OTA is only large when the input signal is large.

The outputs of the LNTA are terminated in large inductors which approximate chokes. This large RF impedance forces the majority of the signal current to pass through the AC coupling capacitors to the passive mixers and the remainder of the receiver.

An LNTA structure as described hereinabove can realize a near-constant-transconductance LNTA which bounds the total magnitude of the intermodulation products in the output current of the LNTA. Because the input impedance of the common-gate LNTA is defined by its transconductance, this also results in a near-constant-input impedance structure suitable for the input of the receiver.

LNTA Implementation

Based on the foregoing calculations and intuition, a stacked push-pull common-gate LNTA was designed using low-threshold voltage devices in a 90 nm RF CMOS process. Shown using a simplified schematic in FIG. 9, the gate voltages of the input devices are defined with replica bias loops that ensure that the quiescent current flowing through the structure is proportional to the input bias current. The source voltages of the input devices are defined at $V_{DD}/2$ by the OTA with the class-AB architecture dictated by the requirements imposed by the large-signal mismatch between PMOS and NMOS devices.

Robustness of Constant-Transconductance Behavior

The eight graphs of FIG. 10A to FIG. 10H illustrate the generation of a transconductance W-shape. The physical intuition behind the W-like shape of the $g_m$-V curve also explains its robustness in the face of PVT variation. To understand why, consider that the shape of the initial square-law I-V and $g_m$-V relations are relatively independent of PVT variation— only the mobility and threshold voltages change, altering the magnitude and breakpoints of the curve, respectively. In a deep submicron process, the mobility degradation is largely a result of normal-field effects that depend on the well-controlled thickness of the MOS oxide layer. Although the intrinsic carrier mobilities can vary +/−50% with doping and temperature, this will only partially effect one of the two linearization mechanisms.

The transition into the linear regime depends on the supply voltage, device threshold voltages, and device overdrive voltages. Its initial behavior is determined by:

$$K = \frac{V_{DS}}{V_{D,SAT}} \approx \frac{V_{DD} - V_{GS} - V_{DD}/2}{V_{GS} - V_{TH}} = \frac{V_{DD}/2 - V_{TH}}{V_{GS} - V_{TH}} - 1 \quad (1)$$

In general, the supply voltage is well-regulated and does not vary much. The value of $V_{GS}-V_{TH}$ for large input signals is dominated by the input signal itself (since the magnitude of $V_S$ will be in general larger than $V_G-V_{TH}$ when the device is on). The value of $V_{GS}-V_{TH}$ when the input is small is determined by the device mobility for a given bias current and given nominal transconductance $g_m$. Given that for small $V_{OD}$ the MOS relation approximates the canonical square-law model, for a constant-$g_m$ biasing, it can be shown that the overdrive voltage $V_{OD}$ is inversely proportional to the device intrinsic carrier mobility. For constant-current biasing it can be shown that the overdrive voltage $V_{OD}$ is inversely proportional to the square root of the device intrinsic carrier mobility. In the latter case, a +/−50% change in mobility results in only a +/−22% change in overdrive voltage. Based on the values used for the models above, this results in $F_s$ varying by about +/−10%, which is a dramatic attenuation of effect from the initial +/−50% change in mobility.

Taken together, in the presence of PVT variation, the shape of the multiplication functional representing the transition into the linear regime in the absence of change in $V_{DS}$ is relatively robust. It is seen previously in the simulation results that the constant-$g_m$ behavior is robust even the presence of changes in $V_{DS}$ with signal swing.

Heuristic Modeling of LNTA Nonlinearity

When fully expanded, the equation used to model the I-V characteristic of the LNTA is rather unwieldy and can be cumbersome to apply. This equation can not precisely reflect simulated and/or measured data. A fitted model to the macroscopic behavior to the LNTA is desirable for proper behavioral simulations. The LNTA nonlinearity is therefore modeled with a set of functions of the form:

$$f(x,a,k) = ax^3 e^{-|k|x^2} \quad (2)$$

Figure 11B:
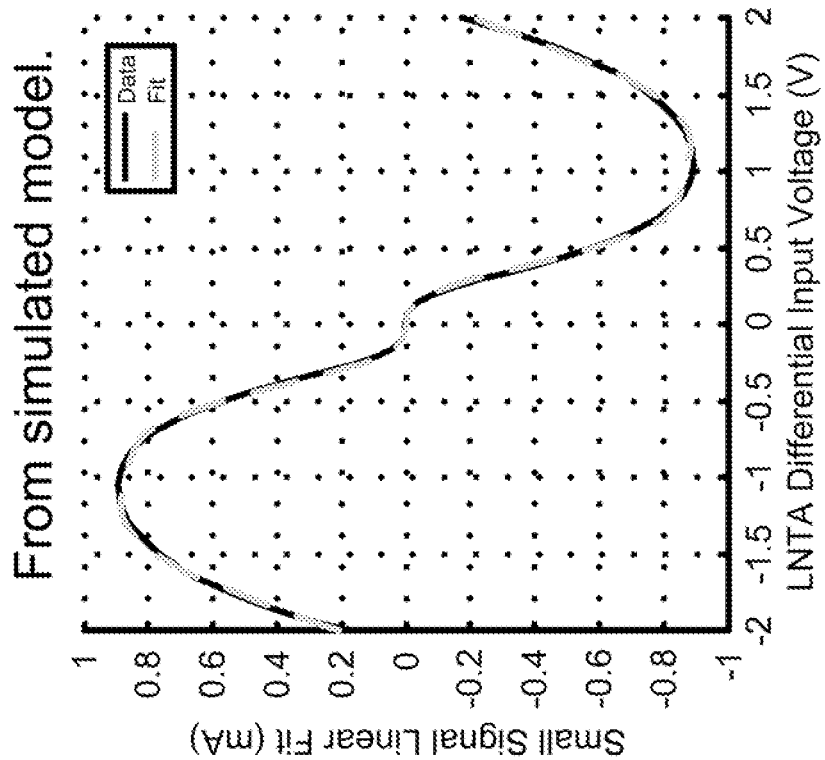
FIG. 11B shows a Cubic-Gaussian basis fit to a simulated static nonlinear residual I-V characteristic simulated model.
Figure 11A:
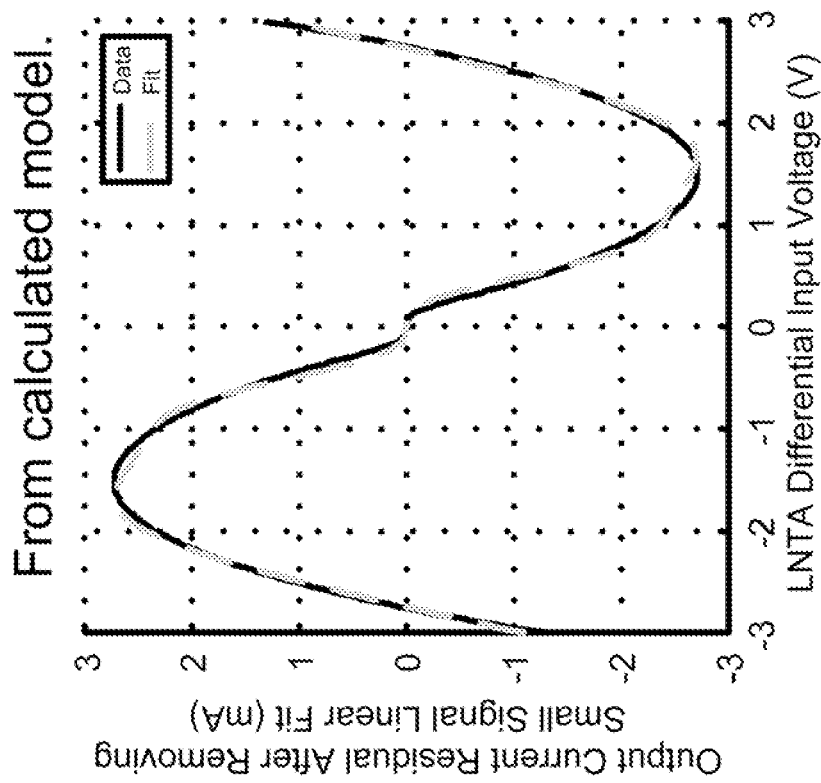
FIG. 11A shows a Cubic-Gaussian basis fit to an analytical model nonlinear residual I-V characteristic calculated model.

For example, an I-V curve of the analytical model nonlinear residual can be well-represented for a differential voltage input by the set of functions f(x,0.08434,0), f(x,−2.199, 0.435), and f(x,−12.59,2.5), as shown in FIG. 11A. The I-V curve of the simulated static nonlinear residual can be well-represented by the set of functions f(x,0.03545,0), f(x,−1.736,0.836), and f(x,−8.867,4.05), as shown in FIG. 11B.

Biasing OTA Implementation

To maintain the proper input common mode voltage of the LNTA a class-AB biasing OTA that consumes little quiescent current was used. The OTA also was configured to be able to source enough current to correct for the large-signal imbalance between the NMOS and PMOS devices. Assuming that the maximum input power used is +12.5 dBm, the current to be sourced is about 2 mA. In order to maintain a degree of margin, the OTA was designed to both sink and source up to 8 mA. Because the real part of the load impedance to be driven by the OTA is nominally 12.5Ω (due to the two input terminals of the LNTA effectively in parallel), to obtain an appreciable degree of loop gain for a small quiescent power draw, a multi-stage OTA topology was used.

Figure 12:
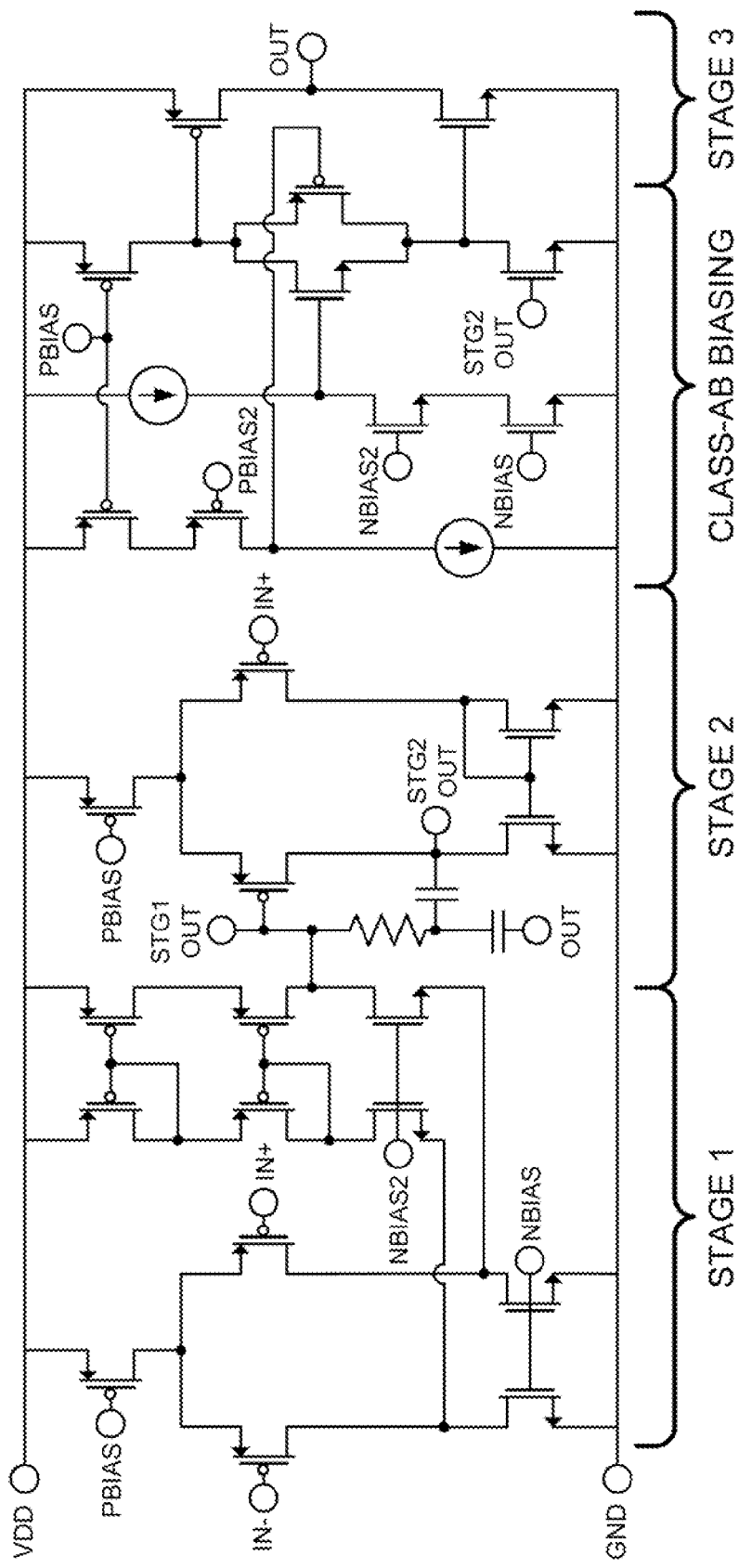
FIG. 12 shows a schematic diagram of one exemplary OTA suitable for use in the LNTA of FIG. 9.

A three-stage reverse-nested-miller-compensated (RNMC) OTA topology was chosen to set the LNTA common mode voltage. The OTA schematic is shown in FIG. 12. It consumed a quiescent current draw of 900 µA while achieving in the typical corner a minimum DC loop gain of 56 dB, minimum unity-gain bandwidth of 4.7 MHz, minimum phase margin of 74.6°, and minimum gain margin of 12.8 dB over the output current swing range of +/−8 mA for a 1 nF LNTA input blocking capacitor separating the LNTA from the driving impedance.

Figure 13:
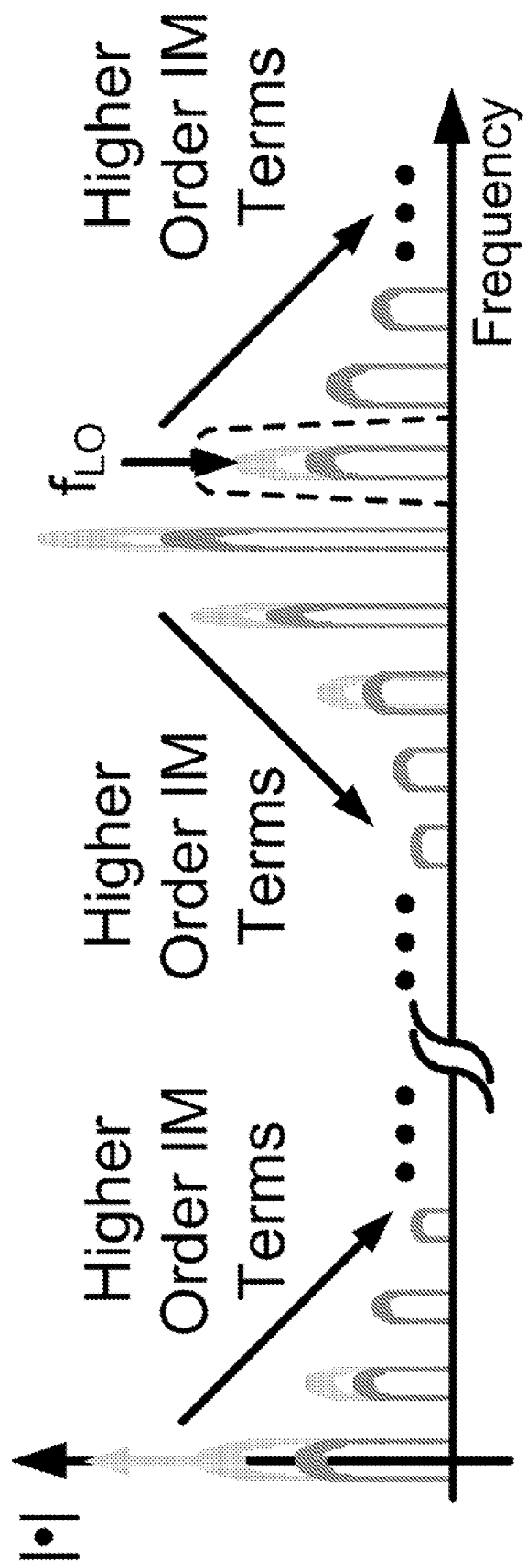
FIG. 13 shows a graph of the magnitude of higher-order IM distortion products plotted versus frequency.

Successive Regeneration and Adaptive Cancellation of Higher-Order Intermodulation Products Cancelling Higher-Order Intermodulation Products Any practical design of a RF receiver has both area and power concerns, creating pressure to operate the receiver with as little performance margin as possible. At the same time, compelling applications exist to motivate the use of a receiver with a rail-to-rail input signal handling capability. Taken together, these goals lead to a high probability for the presence of higher-order odd and even intermodulation products within the receiver as illustrated by the graph of FIG. 13.

Less Desirable Approaches to Cancelling Higher-Order Intermodulation Products

Figure 14A:
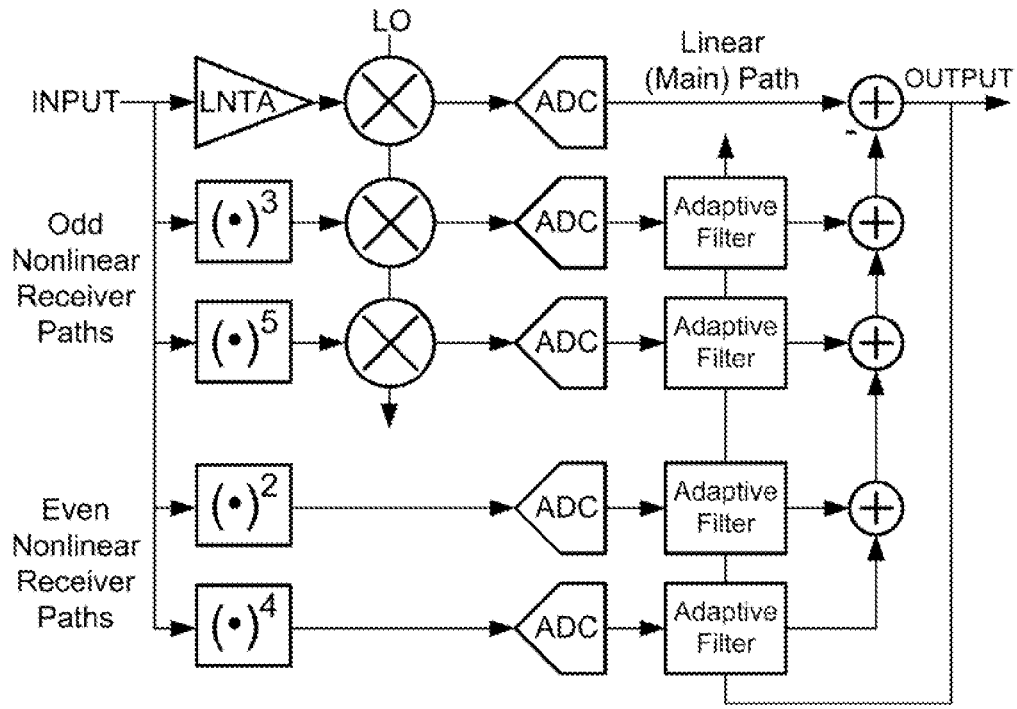
FIG. 14A shows a system using a relatively large number of analog to digital converters.

One approach (see FIG. 14A) to cancelling the higher-order intermodulation products is to provide a reference branch for each polynomial term, each with a nonlinear term generator of an appropriate order followed by a downconversion mixer for the odd-order terms. Each reference branch would require a separate analog-to-digital converter followed by an adaptive filter whose weights are updated by a correlation operation on the output of the complete equalizer. In this case, the composite LMS-based adaptive equalizer uses a reference basis that is not merely polynomial in the z-domain (discrete time) due to its multitap implementation but that is polynomial in the signal amplitude domain.

Figure 15:
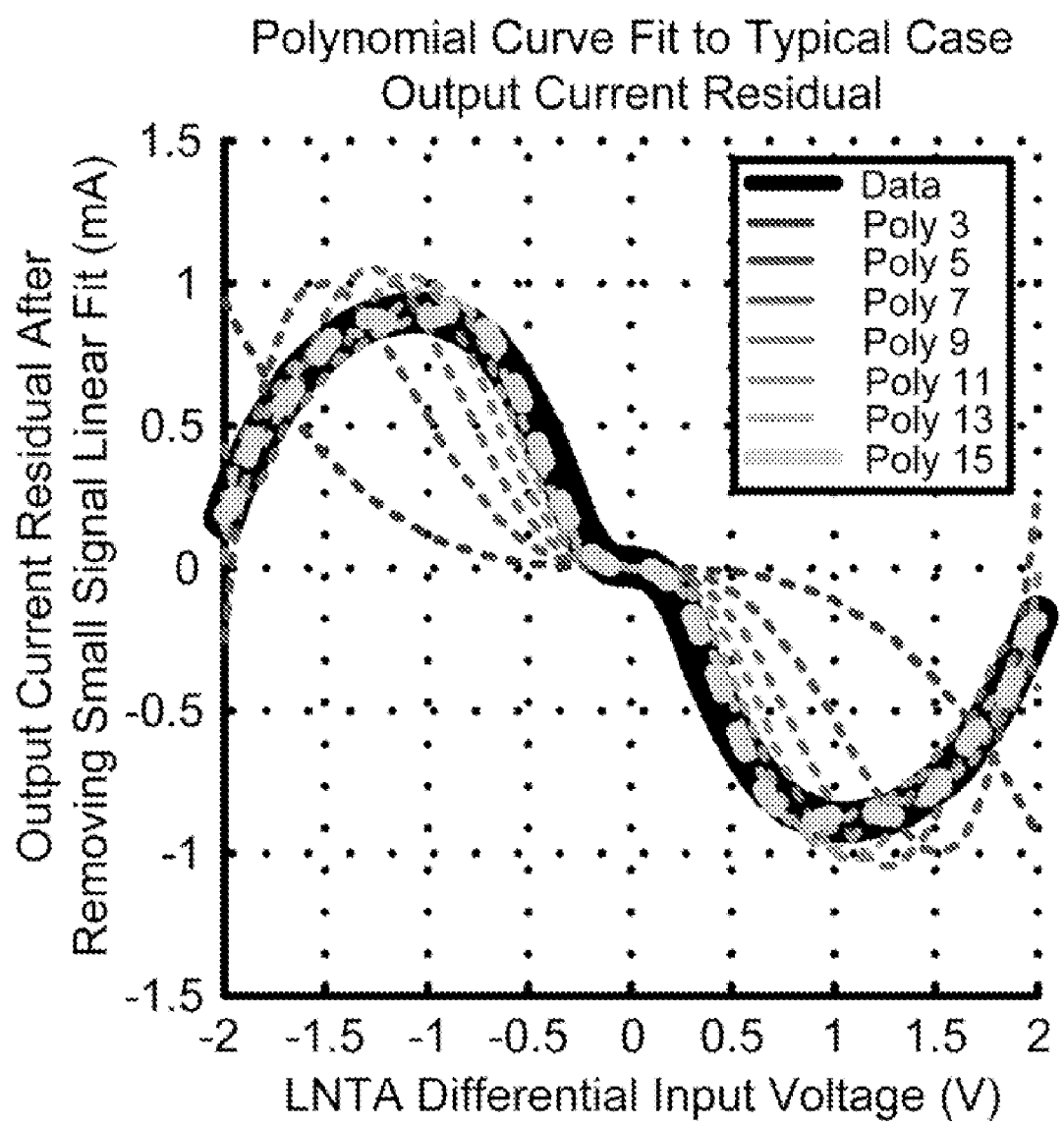
FIG. 15 shows a graph of a polynomial fit to residual I-V characteristic of LNTA after a small-signal linear fit is removed.

One problem with using such an architecture is the large number of amplitude polynomial terms used. For example, to generate a fit for a simulated LNTA residual with rms error of 5.5%, we would need a 15th-order polynomial, as seen in the graph of FIG. 15. For the odd-order reference basis terms, this result calls for at least 14 analog-to-digital converters.

Figure 14B:
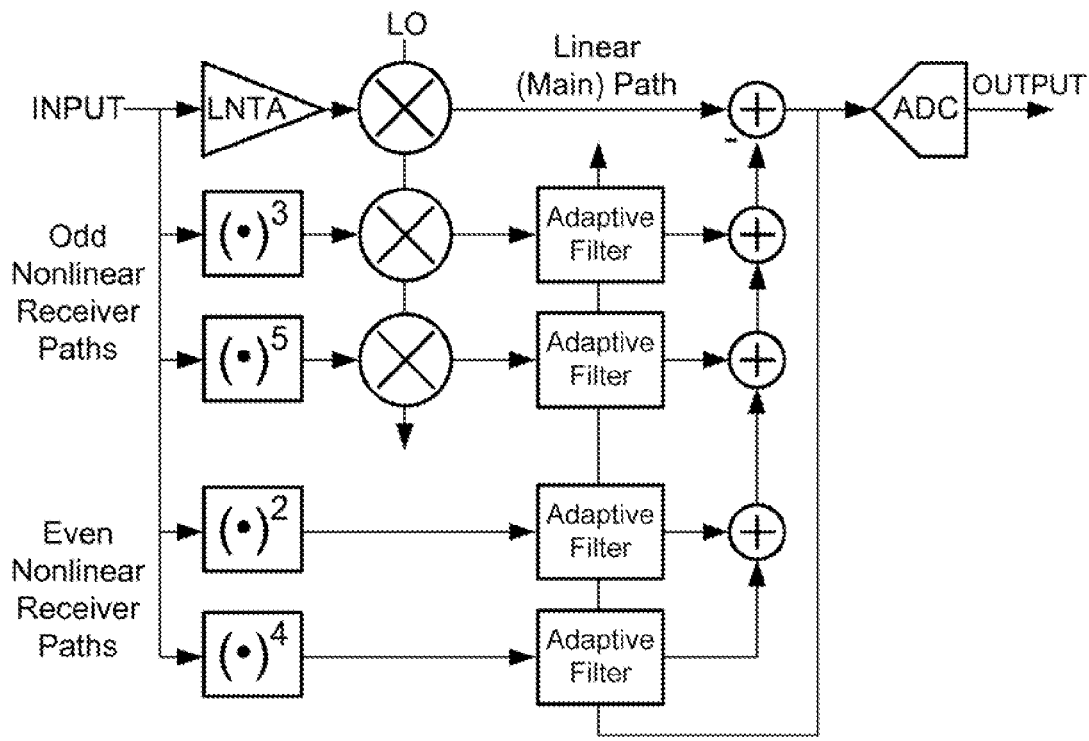
FIG. 14B shows the adaptive cancellation algorithm at analog baseband in the analog domain.

One solution to the problem of having many analog-to-digital converters is to move the adaptive equalizers to the analog domain as shown in FIG. 14B. Although these circuits are better controlled and have been implemented in the digital domain, accurate implementations can be had in the analog domain as well. However, in order to ensure that the adjacent channel signal in the main receiver path does not interfere with the correlation process of the adaptive algorithm, it should be completely filtered out prior to the adaptive equalizers. In some cases, fifth- to seventh-order low-pass filters are used to meet telecommunications standards such as UMTS and CDMA. Combined with the analog adaptive algorithms, this filtering burden would prove to be less desirable with respect to power, and area burden for the analog die. For both of these less desirable solutions, creating seven odd-order intermodulation distortion reference circuits results in a similar burden for the analog die.

One method to cut down on the number of polynomial bases led to development of a functional basis of elements. In this case a reference basis of three elements results in an rms error of 2.3%. However, it is unclear how to generate such a basis in the analog domain without also generating a large linear term that, when applied to the adaptive algorithm, would result in the partial cancellation of the desired signal.

Cancelling Higher-Order Intermodulation Products

General Embodiment

Figure 16A:
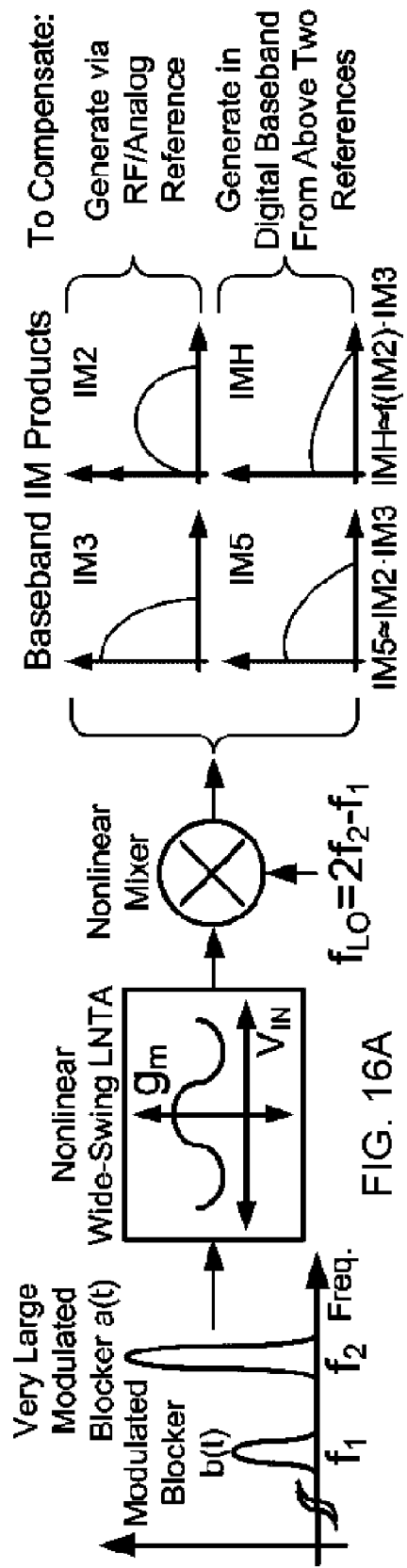
FIG. 16A shows a conceptual diagram of a successive regeneration and adaptive feedforward cancellation method of intermodulation products at baseband.
Figure 16B:
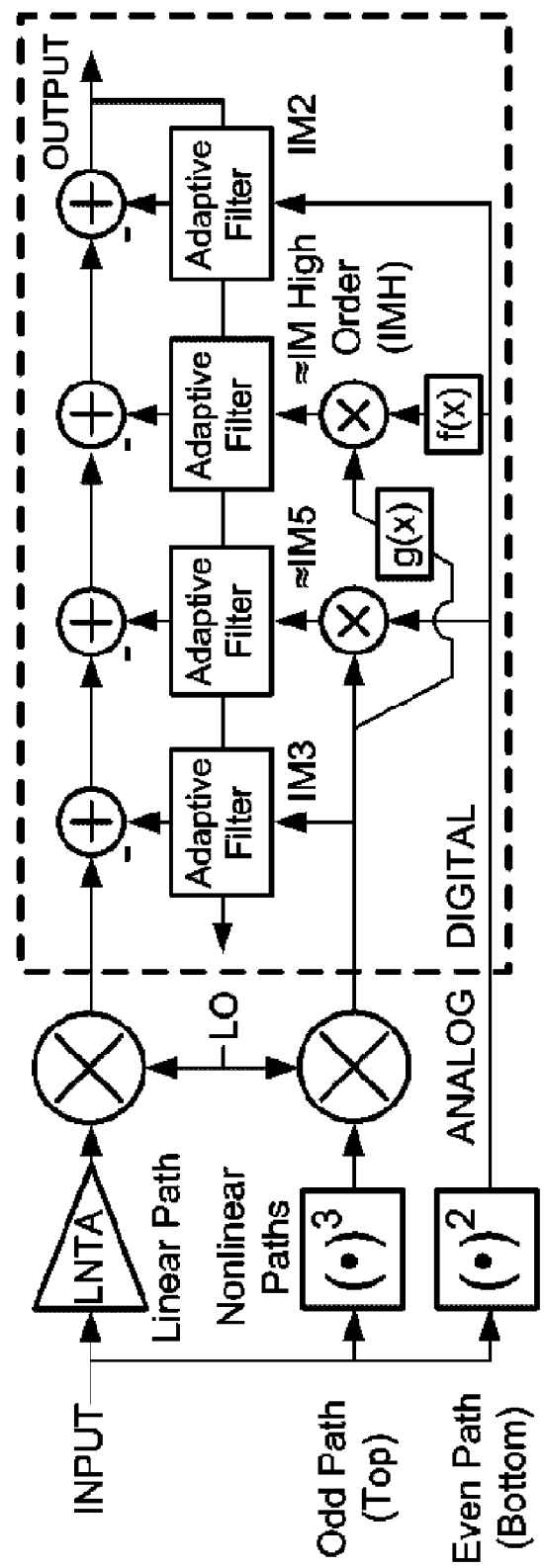
FIG. 16B shows a simplified block diagram of a system following the concepts FIG. 16A.
Figure 16C:
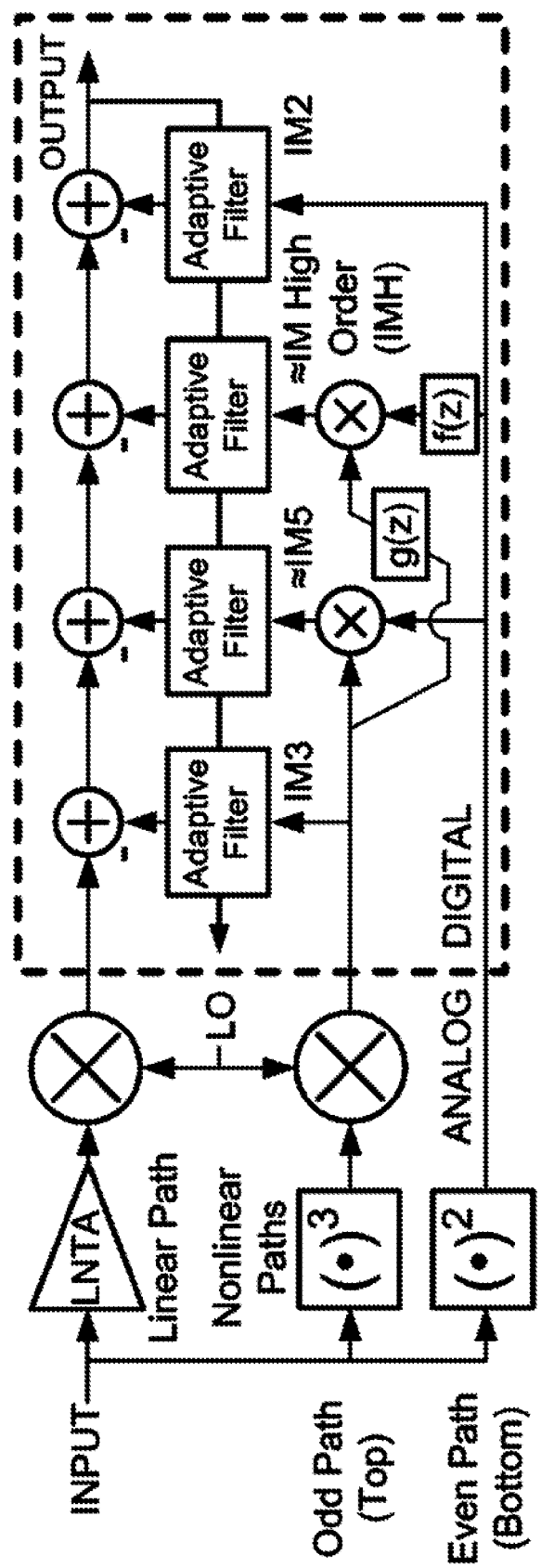
FIG. 16C shows a simplified block diagram following the concepts FIG. 16A which includes discrete time functions.

FIG. 16B shows a generalized block diagram of one exemplary large-signal receiver architecture that employs the method shown in FIG. 16A. Here, IM2 and IM3 terms are multiplied together to create approximations to IM5 products, IM2 terms are multiplied by IM2 and IM3 terms to generate IM7 terms, and so on. FIG. 16C shows the general embodiment of FIG. 16B using discrete time functions.

Alternative Embodiments

Odd Only, Even Only Cases

Figure 16D:
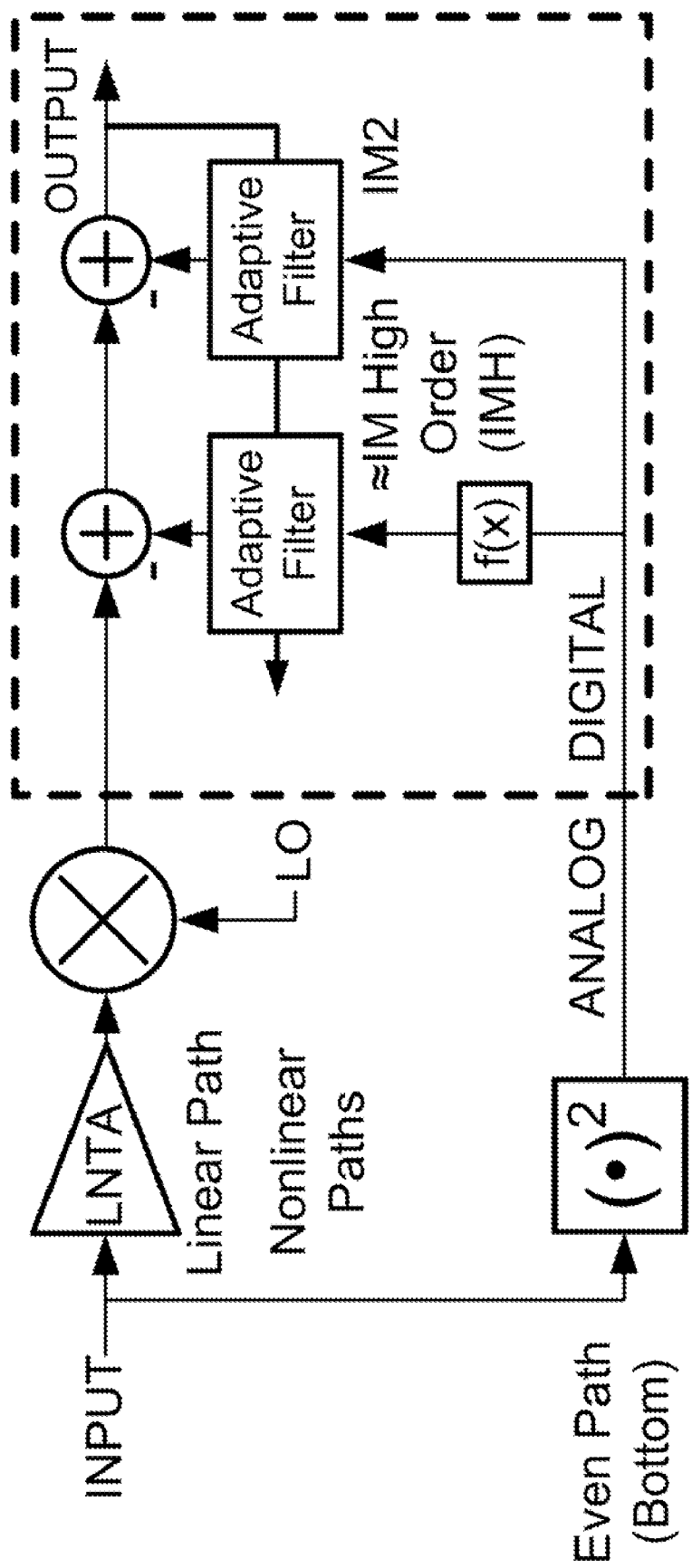
FIG. 16D shows a simplified block diagram of another embodiment of an incompressible receiver having a main path and alternate path with an even path correction scheme.

In other embodiments, there are cases where only odd order IM terms or even order IM terms are used (e.g. only the odd path or only the even path of the alternate path of FIG. 16B is used). Referring to the general embodiment of FIG. 16B, all odd order IM terms can be turned off by turning off the nonlinear reference term generator (shown in FIG. 16B as a cubic term generator). Turning off a nonlinear term generator can be done using any suitable switching or software technique. For example, the input and/or outputs of the odd order nonlinear term generator can be switched off. Alternatively, where a nonlinear term generator has internal coefficients (e.g. of a mathematical equation or as represented by a look-up table), those coefficients or terms can be set to zero. By turning off, for example, the odd order (odd path) nonlinear term generator, a special case is reached, as shown in FIG. 16D which has only an even path. By turning off the even path reference generator, another special case is reached where there is only an odd path active, in a manner analogous to FIG. 16D.

An equivalent outcome can be obtained if all of the circuit elements related to one or the other of the odd order IM terms or even order IM terms are omitted from the circuit. Turning off the odd path, by turning off the odd path nonlinear term generator, is equivalent to eliminating the odd path nonlinear term generator as well as any functions that take an input only from the nonlinear term generator. Turning off the even path, by turning off the even path nonlinear term generator, is equivalent to eliminating the even path nonlinear term generator as well as any functions that take input only from the nonlinear term generator. Thus any FIG. 16B blocks which are always turned off or zeroed out (as well as related blocks used only for the removed path or function), need not be present at all.

In still other embodiments, it can be advantageous to have present and "on" both the odd order and the even order nonlinear reference generators (e.g. the cubic and square term reference generators of FIG. 16B), and to turn off only the higher order terms as provided by either an odd order function block (e.g. g(x), FIG. 16B), such as, for example, $g(x)=ax^3+bx^5+cx^7$ or an even order function block (e.g. f(x), FIG. 16B), such as, for example, $f(x)=ax^4+bx^6+cx^8$. As in the case of the nonlinear reference generator, turning off a function block can be done in either hardware (e.g. switches at the function block input and/or output) or in software, such as by setting all of the coefficents of a function block look up table or of a function block mathematical function to substantially zero (i.e. "zeroing out") the function block.

Although this generalized approach of FIG. 16B (and 16C) appears to be similar to polynomial predistorters used in RE transmitters in that even-order baseband IM products are successively multiplied, it is fundamentally different in several aspects. First, polynomial predistorters derive the exact envelope of the incoming signal, successively multiply this envelope, and then apply the resultant higher-order terms to the incoming signal at RF. In our approach, successive multiplication is performed at digital baseband and the original IMD-generating signals are not available. The large IMD generating signals are not available because their frequencies are not known and because their frequency spacing can be too large to be accommodated by any auxiliary path analog-todigital converters if it were decided to downconvert and digitize the entire frequency band over which large undesired signals can lie. Rather, a derivative of the large input signals is used, namely the IM3 products, since their frequency is known. In addition, when the baseband output is known to be corrupted, this frequency is known to be the receiver LO frequency.

Second, the polynomial predistorters reside in the analog domain at RF. In principle they can also be partially or fully implemented in the digital domain. The circuit designer has all of the information of the IMD-producing signal at any point in the circuit, since, for example, the radio transmitter output signal is generated from within the radio. The proposed receiver architecture, however, performs the nonlinear reference generation at RF of both IM2 and IM3 products due to lack of knowledge of the large blocking signals and due to the current-mode nature and bandpass filtering of the proposed large-signal receiver. Because the successive regeneration should advantageously be performed at digital baseband to save on analog circuitry, a frequency-translating element is placed within the odd-order nonlinear reference path to downconvert the signal from RF. This feature is neither needed nor desired with polynomial predistorters.

Third, the proposed approach taken to regenerate nonlinear reference terms in a receiver is not a predistortion technique but rather a parallel-distortion technique which is effectively matched to the nominally linear receiver branch via adaptive equalizers.

Fourth, unlike the polynomial predistorter that directly processes relevant IMD terms, our nonlinear reference generation scheme can deal with odd-order IMD products unrelated to the ones corrupting the signal band around the LO frequency of the receiver. When downconverted, these signals should be filtered out in order to avoid unintended aliasing to baseband during the digital sampler process. Hence, the placement and design of postfiltering within analog IM3 and IM2 branches is relatively complex, as compared with the more easily implemented polynomial predistorter.

Analysis of Successive Multiplication

In order to determine the validity of such a procedure, blocker signals with complex envelopes $a(t)=a_I(t)+a_Q(t)$ and $b(t)=b_I(t)+b_Q(t)$ upconverted to frequencies $f_2$ and $f_1$, respectively, result in the following baseband IM products when the LO frequency is set to $2f_2-f_1$. Dropping the time argument (t) for brevity, the baseband nonlinear terms can be derived. Symbolic calculations to obtain these expressions were generated by the Matlab symbolic toolbox (available from The MathWorks, Inc. of Natick, Mass.) and are shown in equation (3) (where $|a|^2=a_I^2+a_Q^2$ and $|b|^2=b_I^2+b_Q^2$):

$$IM2 = \alpha_2(a_I^2 + a_Q^2 + b_I^2 + b_Q^2) \quad (3)$$

$$IM3_I = \alpha_3(a_I^2 b_I + 2a_I a_Q b_Q - a_Q^2 b_I)$$

$$IM3_Q = \alpha_3(-a_I^2 b_Q + 2a_I a_Q b_I - a_Q^2 b_Q)$$

$$IM4 = \alpha_4(IM2^2 + 2(a_I^2 + a_Q^2)(b_I^2 + b_Q^2))$$

$$IM5_{I,Q} = \alpha_5 \left( \frac{5}{3} IM3_{I,Q} IM2 \left( 1 + \frac{1^2}{2} \frac{|b|^2}{IM2} \right) \right)$$

$$IM7_{I,Q} = \alpha_7 \left( \frac{35}{16} IM3_{I,Q} IM2^2 \left( 1 + \frac{2^2}{2} \frac{|b|^2}{IM2} + \ldots \right) \right)$$

$$IM9_{I,Q} = \alpha_9 \left( \frac{21}{8} IM3_{I,Q} IM2^3 \left( 1 + \frac{3^2}{2} \frac{|b|^2}{IM2} + \ldots \right) \right)$$

-continued $$IM11_{I,Q} = \alpha_{11} \left( \frac{385}{128} IM3_{I,Q} IM2^4 \left( 1 + \frac{4^2}{2} \frac{|b|^2}{IM2} + \ldots \right) \right)$$

$$IM13_{I,Q} = \alpha_{13} \left( \frac{429}{128} IM3_{I,Q} IM2^5 \left( 1 + \frac{5^2}{2} \frac{|b|^2}{IM2} + \ldots \right) \right)$$

$$IM15_{I,Q} = \alpha_{15} \left( \frac{15015}{4096} IM3_{I,Q} IM2^6 \left( 1 + \frac{6^2}{2} \frac{|b|^2}{IM2} + \ldots \right) \right)$$

Performing a similar analysis for the higher-order terms resulting from the proposed successive multiplication yields equation (4):

$$IM2 = \alpha_2(a_I^2 + a_Q^2 + b_I^2 + b_Q^2) \quad (4)$$

$$IM3_I = \alpha_3(a_I^2 b_I + 2a_I a_Q b_Q - a_Q^2 b_I)$$

$$IM3_Q = \alpha_3(-a_I^2 b_Q + 2a_I a_Q b_I - a_Q^2 b_Q)$$

$$IM4 = \alpha_4 IM2^2$$

$$IM5_{I,Q} = \alpha_5 \left( \frac{5}{3} IM3_{I,Q} IM2 \right)$$

$$IM7_{I,Q} = \alpha_7 \frac{35}{16} (IM3_{I,Q} IM2^2)$$

$$IM9_{I,Q} = \alpha_9 \left( \frac{21}{8} IM3_{I,Q} IM2^3 \right)$$

$$IM11_{I,Q} = \alpha_{11} \left( \frac{385}{128} IM3_{I,Q} IM2^4 \right)$$

$$IM13_{I,Q} = \alpha_{13} \left( \frac{429}{128} IM3_{I,Q} IM2^5 \right)$$

$$IM15_{I,Q} = \alpha_{15} \left( \frac{15015}{4096} IM3_{I,Q} IM2^6 \right)$$

For large $|a|$, $IM2 \approx |a|^2$ and the ratio of the leading error term to the IM2 term is given by equation (5):

$$IM5: \frac{1^2}{2} \frac{|b|^2}{|a|^2} \quad (5)$$

$$IM7: \frac{2^2}{2} \frac{|b|^2}{|a|^2}$$

$$IM9: \frac{3^2}{2} \frac{|b|^2}{|a|^2}$$

The error between the true IMD products and the regenerated IMD products decreases as one of the two blockers dominates the other. Hence, the successive intermodulation distortion regeneration schemes described herein result in approximations to the true baseband intermodulation products in the nominally linear receiver path that are increasingly valid as one of the blockers dominates the other.

This analysis assumes that the nonlinearity in the nominally linear (main) receiver path occurs at RF and is memoryless. However, an RF nonlinearity with memory has the effect of imbuing a different phase rotation to each of the odd-order IMD components. Given that our adaptive cancellation scheme allows a for different phase rotation for each nonlinear basis element, the presence of nonlinearity with memory in the nominally linear portion of the receiver path will not constitute a limiting factor in the process of cancelling the baseband intermodulation products.

Approximation

Figure 17A:
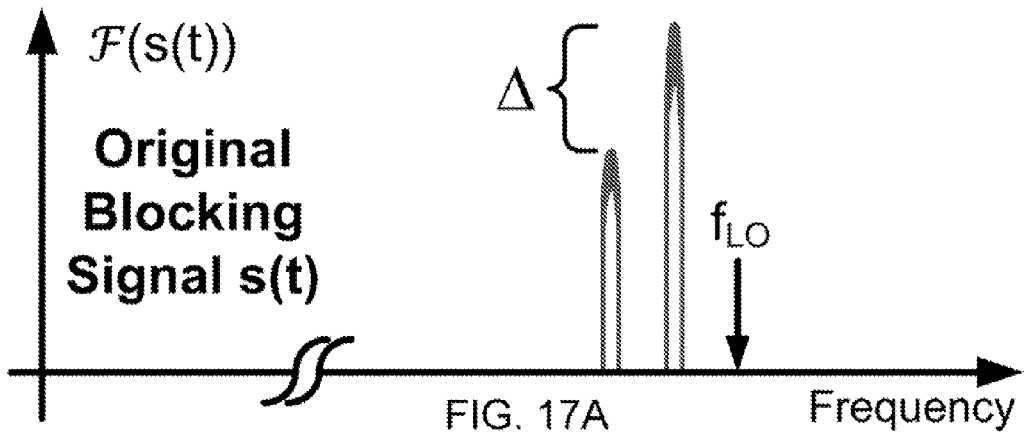
FIG. 17A shows a graph in the frequency domain for large blocker asymmetries where all blockers are considered as a single narrowband signal s(t).
Figure 17B:
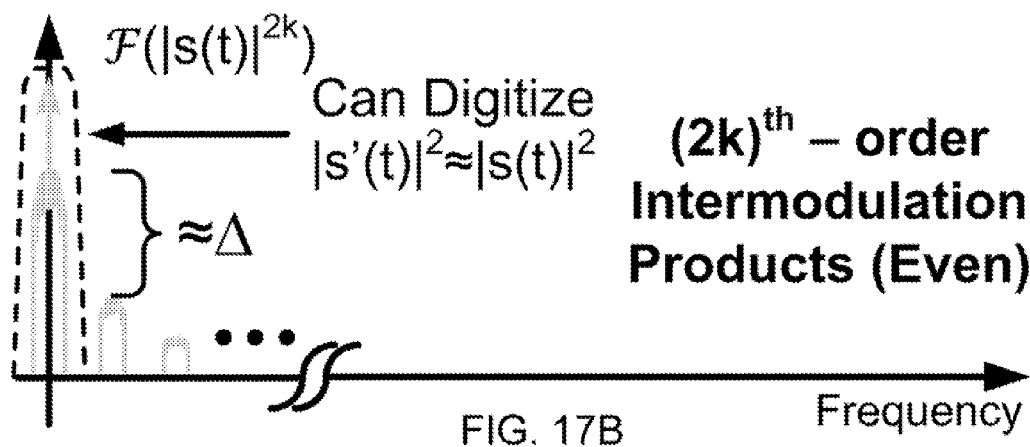
FIG. 17B shows a graph in the frequency domain where the envelope of s(t) and the terms immediately surrounding DC are considered.
Figure 17C:
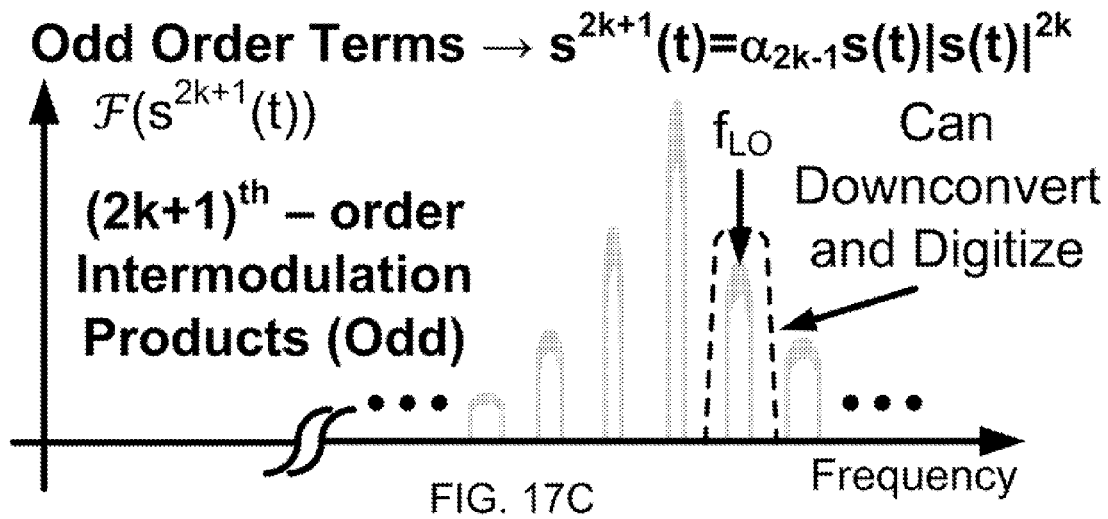
FIG. 17C shows a graph in the frequency domain where higher-order odd intermodulation products at RF and those surrounding the LO frequency are considered.

FIG. 17A to FIG. 17C are graphs in the frequency domain which show an intuitive approach as to why baseband successive regeneration provides a good approximation for large blocker asymmetries. In FIG. 17A, all blockers are considered as a single narrowband signal s(t). In FIG. 17B, the envelope of s(t) and the terms immediately surrounding DC are considered, and in FIG. 17C, higher-order odd intermodulation products at RF and those surrounding the LO frequency are considered.

FIG. 17A, shows that it can suffice to consider all blockers as one composite signal s(t). The blocking signal s(t) can comprise two or more subsignals, but its defining characteristic is that the blocking profile is dominated by only one of them. For any single signal s(t), s(t) multiplied by successive powers of its envelope result in higher-order odd intermodulation products around the original frequency of s(t).

However, due to the bandlimited nature of the analog to digital converters, only the portion of the envelope around DC can be digitized. Other IM2 envelope terms that lie far away from DC due to the out-of-band nature of the blockers cannot be digitized. In the case of one dominant blocker (FIG. 17B), the DC portion of the envelope contains the bulk of the information in the envelope signal and for this reason the approximations to the higher-order terms improve as one blocker dominates the input spectrum.

To effectively regenerate higher-order terms (FIG. 17C), we obtain signal information around the LO frequency. However, for the out-of-band blocking scenario of s(t) there does not exist any significant signal content. However, in the spectrum of $s(t)|s(t)|^2$, namely the IM3 spectrum, there does exist signal content around the LO frequency. Since $s(t)|s(t)|^2$ is a linear combination of all of the narrowband IM3 products resulting from the original input blocking profile s(t), applying the envelope approximation $|s'(t)|^2$ to each of these subterms results in an approximation to the IM5 products that would appear around each of the narrowband carrier frequencies.

Finally, due to the invariance of performing the multiplication by an amplitude-modulated signal such as the envelope at RF or at baseband, this multiplication can be performed at baseband after downconverting odd-order terms to generate approximations to IM5, IM7, and higher-order terms.

Justification of Approximation

Figure 18A:
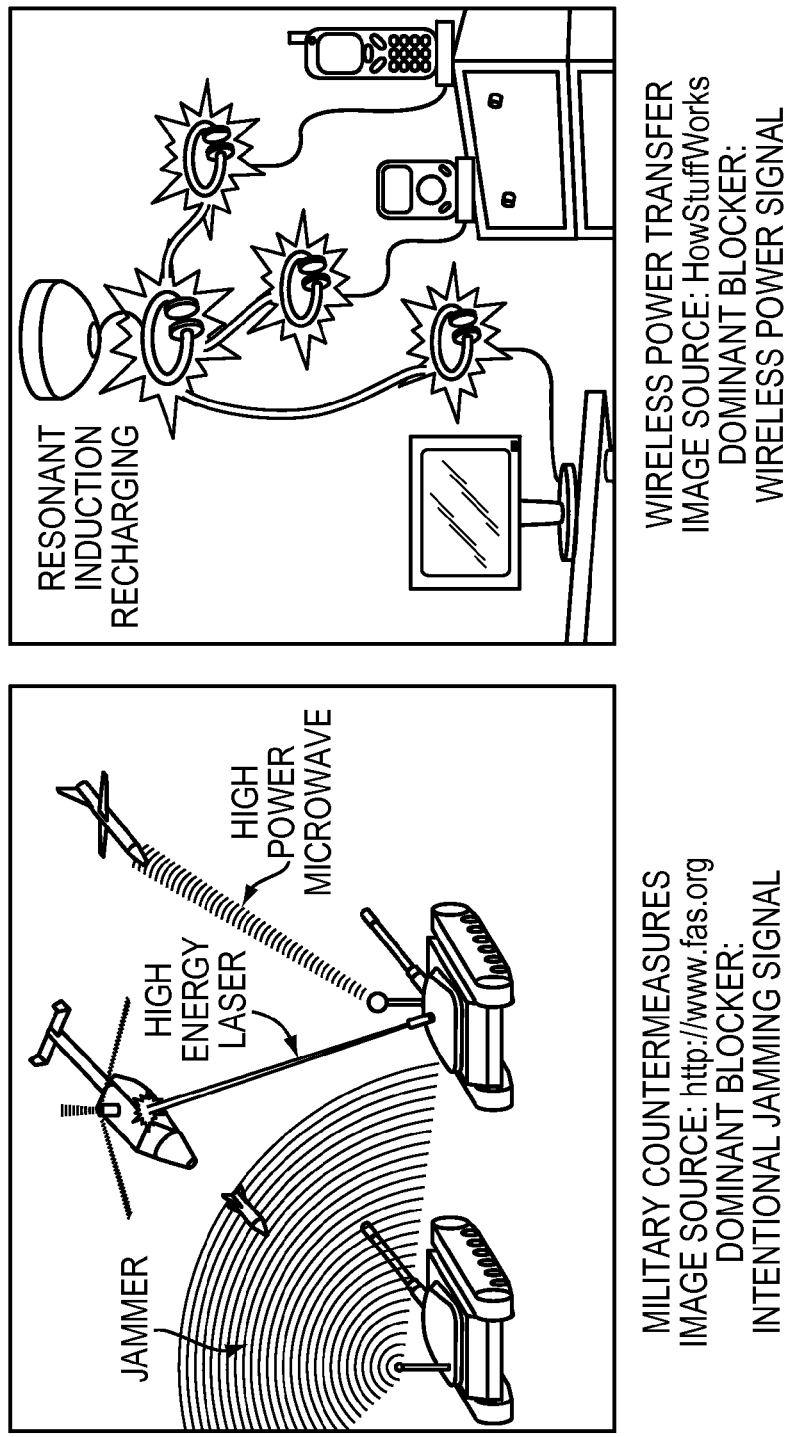
FIG. 18A and FIG. 18B show graphic representations of three exemplary incompressible receiver application areas: military countermeasures, wireless power transfer, and FDD communications.
Figure 18B:
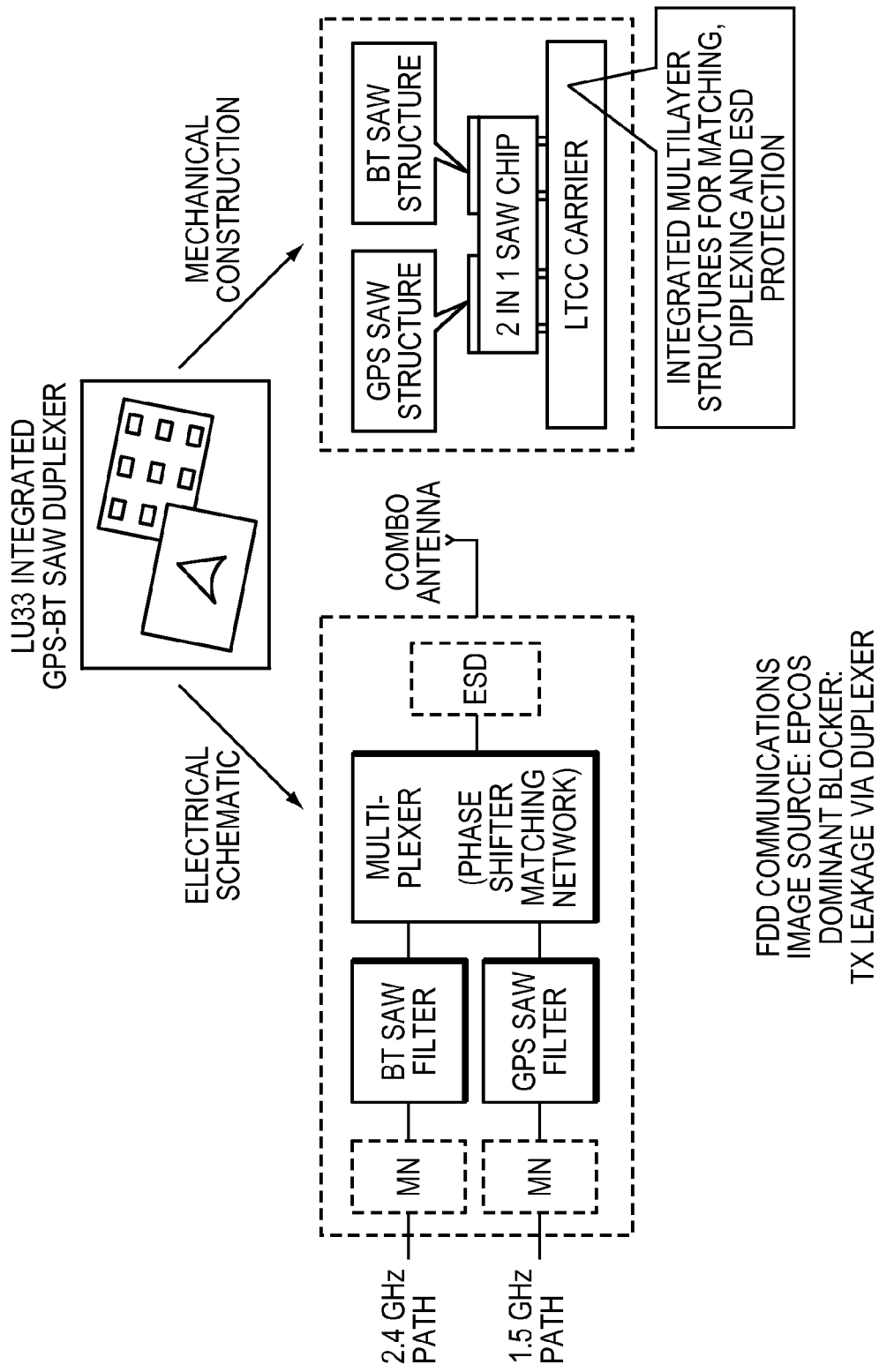

FIG. 18A and FIG. 18B show graphic representations of three exemplary fields of application, military countermeasures, wireless power transfer, and FDD communications, which can benefit from the incompressible receiver technology described herein. Although the receiver achieves large cancellation performance predominantly for large ratios of $|a(t)|/|b(t)|$, this condition is precisely the same as that of many nonlinear blocking problems, as shown in FIG. 18A and FIG. 18B. For example, in FDD communications systems with relaxed PA/LNA isolation, the TX leakage appears as the dominant blocker to the receiver. Also, implantable medical sensors that receiver power wirelessly demodulate a small data signal in the presence of a dominant power transfer signal. Finally, radar systems and military communications systems need to operate correctly in the presence of a large dominant hostile jammer signal.

Greater-than-Two-Tone Blocking Scenarios Third Tone Involved in IM3 Generation

From the viewpoint of the approximation made when moderate-frequency baseband envelope signal content is discarded, the approximation is valid no matter how many tones are involved in IM3 generation, so long as only one of them dominates.

Multiple Tones not Involved in IM3 Generation

If there are multiple tones not involved in IM3 generation, they will appear as part of higher-order IM products due to their contribution to the portion of the envelope at DC. In this case, the approximation is exact.

Use of Functional Basis Elements

In order to well-approximate nonlinearities in the main receiver path such as the residual of the LNTA, it is useful to use a compact functional representation. In this case, the basis of Gaussian functions lends itself well to the block diagram of FIG. 16B in that an exponential function can be raised to a function of the IM2 signal and multiplied by the IM3 signals to recreate approximations to the terms generated in the actual LNTA.

However, this approach works for general functions as well. As any function can be approximated by a polynomial, any odd-order nonlinear term will consist of a polynomial $f(x)=ax^3+bx^5+cx^7+\ldots$ Performing a polynomial expansion of an even-order function $f(x^2)$ yields $f(x^2)=a+bx^2+cx^4+dx^6+\ldots$ which can approximate any even-order IM distortion. Multiplying this by IM3 terms yields $x^3 f(x^2)=ax^3+bx^5+cx^7+dx^9+\ldots$ which can yield any odd-order distortion.

The functional blocks f(x) and g(x) as shown in FIG. 16B represent functions (e.g. nonlinear functions) typically with respect to the amplitude of the incoming signal. As shown in FIG. 16C, these blocks can also be implemented as functions f(z) and g(z) as discrete-time delays of the incoming signals. In this fashion, f(z) and g(z) can, for example, include digital IIR or FIR filters. This can be done to reproduce memory effects present in either the main or alternate paths of the receiver such that the resultant reference intermodulation product inference properly cancels that of the main or alternate paths.

As shown in FIG. 16B and FIG. 16C, in some embodiments of the incompressible receiver, any term (e.g. and odd-order nonlinear term) can be provided by a function block (e.g. g(x)). The function block receives as input the downconverted nonlinear term generator signal (the nonlinear generator output mixed with the LO), and/or the output of a square term generator in an even path (e.g. f(x)). The output of the function block is shown electrically coupled to an input of a higher-order term (higher-order term) mixer. The output of the even term generator is shown electrically coupled to a second input terminal of the higher-order term mixer. The higher-order term mixer output is electrically coupled to the output of the alternate path of the second dual path of the incompressible receiver, typically via an intermediate adaptive filter, and combined with the output of the primary or main path of the of the incompressible receiver such that the odd-order nonlinear distortion signals are substantially attenuated at an output of the combining element, and thus at the output of the incompressible receiver.

It is understood that any of the functions described herein (e.g. f(x), g(x), f(z), g(z) of FIG. 16B and FIG. 16C) can be performed in hardware or software. For example, a look-up table in either hardware (e.g. eprom or eeprom) or in software can be used. In other embodiments, there can be a processor which can execute one or more algorithms which can perform these functions. In yet other embodiments, a dedicated digital circuit can be configured to perform a mathematical function. Such dedicated digital circuit can include any suitable combination of digital logic.

As discussed hereinabove, FIG. 16D shows a simplified block diagram of an embodiment of an incompressible receiver having a main path and an alternate path with an even path correction scheme. In some embodiments of an incompressible receiver it can be sufficient to synthesize only even order IM corrections in the receiver second or alternate path. The exemplary embodiment shown in FIG. 16B shows a square term generator used to synthesize both IM2 products as well as a function f(x) (e.g. a polynomial function) used to synthesize one or more even higher order IM products. The difference between the embodiments of FIG. 16B and FIG. 16D is that in the even order correction scheme of FIG. 16D, the nonlinear term generator and odd order related corrections components are turned off and/or not present. Thus it can be seen that an incompressible dual path receiver can have a second or alternate path having an even path, an odd path, or both an even and an odd path IM correction scheme.

Cancellation of IM Products at Higher-Order Frequency Offsets

The scheme shown in FIG. 16A and FIG. 16B might be viewed as somewhat limited since the odd nonlinear path is shown as a pure cubing circuit. FIG. 19A to FIG. 19D are graphs in the frequency domain which show an insufficiency of a pure cubic basis for an odd-order nonlinear reference in the presence of higher-order terms in the nominally linear path.

To see why, it suffices to consider that the linear (main) receiver path is capable of generating nonlinear terms of order much greater than 3. Thus, there will exist in the linear (main) path at the higher-order intermodulation frequency offsets of, for example, $3f_1-2f_2$ and $3f_2-2f_1$ IM5, IM7, and higher-order IM terms. At the frequency offsets of $4f_1-2f_2$ and $4f_2-3f_1$ there will similarly exist in the linear main path IM7, IM9, IM11, and higher-order terms. However, the odd nonlinear path generates reference intermodulation distortion products in response to a two-tone blocking scenario at the frequencies $2f_2-f_1$ and $2f_1-f_2$ only. In this case, the successive regeneration and cancellation of nonlinear terms can only proceed if $f_{LO}=2f_1-f_2$ or $f_{LO}=2f_2-f_1$. This situation is shown in the graphs of FIG. 19A and FIG. 19B and FIG. 19C and FIG. 19D, where odd-order intermodulation products exist at the LO frequency in the linear path but not in the nonlinear path (e.g. where a $3f_2-2f_1$ component is present in the main path frequency domain representation of FIG. 19B, but not in the nonlinear alternate path frequency domain representation of FIG. 19D).

Based on our realization that the nonlinear reference in the nonlinear odd path does not need to be a pure cubing circuit or cubic term generator, in some embodiments of the incompressible receiver, higher-order terms can be included in the odd-order nonlinear term generator. FIG. 20A and FIG. 20B, for example, show successive regeneration and adaptive feedforward cancellation of intermodulation products technique which was implemented at baseband. FIG. 20A shows symbolic representation of the concept and FIG. 20B shows a simplified system block diagram of a receiver architecture which performs the conceptual method of FIG. 20A.

Both the linear path and the nonlinear reference each can be configured to generate a single basis set of polynomial terms that decreases in absolute magnitude as the order of the polynomial term increases. The problem of the successive regeneration and adaptive cancellation scheme then turns to expanding the nonlinear path basis into a new basis set that can be used to span the possible basis elements realizable by the nonlinearities in the nominally linear path.

Denoting the leading coefficients of the polynomial terms in the odd nonlinear term generator as $1>\alpha>\beta>\ldots$, the nonlinear path will produce odd-order reference terms at higher-order intermodulation frequency offsets such as $3f_1-2f_2$ and $4f_1-3f_2$. These terms will be lower in magnitude than those at the IM3 offset of $2f_1-f_2$ and $2f_2-f_1$ but as long as the coefficient relationship of $1>\alpha>\beta>\ldots$ is similar to that of the linear (main) path, the effectiveness of the cancellation will not be compromised.

Analysis of Higher-Order IMD Terms AT IM3-Offset

With such a nonlinear reference generator, we now describe the case of $f_{LO}=2f_1-f_2$ and $2f_2-f_1$. Since the nonlinear reference is of impure order (i.e. no longer a pure cubing circuit), it can be seen that the achievable cancellation of nonlinear terms in the linear (main) path could be limited if under some conditions the nonlinearity in the main path were to return to a pure third-order term. However, this is not the case. Although the initial nonlinear reference term would be impure at IM3+αIM5+βIM7, the successive nonlinear reference terms would be approximately IM5+αIM7+βIM9, IM7+αIM9+βIM11, and so on. Provided that the nonlinear reference generator has been designed such that $1>\alpha>\beta\ldots$, the adaptive equalization algorithms would choose the following DC weights:

IM3:1

IM5:−α

$$IM7:\alpha^2-\beta \qquad (6)$$

such that the composite signal generated by adaptive equalization algorithms to cancel the IM3 terms in the main path is given by IM3branch:IM3+αIM5+βIM7

IM5branch:−αIM5−α²IM7−αβIM9

IM7branch:+(α²−β)IM7+(α³−αβ)IM9+(α²β−β²)IM11

$$\text{Composite:IM3}+(\alpha^3-2\alpha\beta)IM9+(\alpha^2\beta-\beta^2)IM11 \qquad (7)$$

Since α and β were small and less than 1 to begin with, their successive products will be much less than 1. Hence, the residual IM9 and IM11 terms from the operation described above will be much smaller in magnitude than the original IM5 and IM7 products. This procedure can be continued until the residual terms are below the noise floor or below the desired cancellation floor of the receiver.

Therefore, it is evident that for the case of linear path IM products falling at an LO offset of $(N+1)f_2-Nf_1$ or $(N+1)f_1-Nf_2$, the leading polynomial term of the nonlinear path output is the $(2N+1)$th-order term representing the IM(2N+1) distortion. Replacing the above IM(2N+1) terms above with IM(2N+3) shows that the above argument also applies to for any possible intermodulation frequency offset. This implies by superposition that for any linear path basis polynomial, in principle enough orders of successive approximation can be regenerated such that the residual terms are negligible with respect to the noise floor.

Analysis of Higher-Order IMD Terms

The higher-order odd IMD products at $3f_1-2f_2$ are, for $IM2=a_I^2+a_Q^2+b_I^2+b_Q^2=|a|^2+|b|^2$, provided in as follows:

$$IM5_I = \begin{pmatrix} a_I^3 b_I^2 - a_I^3 b_Q^2 + 6a_I^2 a_Q b_I b_Q - \\ 3a_I a_Q^2 b_I^2 + 3a_I a_Q^2 b_Q^2 - 2a_Q^3 b_I b_Q \end{pmatrix} \qquad (8)$$

$$IM5_Q = \begin{pmatrix} a_Q^3 b_I^2 - a_Q^3 b_Q^2 + 6a_I a_Q^2 b_I b_Q - \\ 3a_I^2 a_Q b_I^2 + 3a_I^2 a_Q b_Q^2 - 2a_I^3 b_I b_Q \end{pmatrix}$$

$$IM7_{I,Q} = \left(\frac{105}{64}\right) IM5_{I,Q}\left(IM2 + \frac{1^2}{3}|b|^2\right)$$

$$IM9_{I,Q} = (189/64) IM5_{I,Q}\left(IM2^2 + \frac{2^2}{3}(|a|^2)(|b|^2) + \ldots\right)$$

-continued $$IM11_{I,Q} = (1155/256)IM5_{I,Q}\left(IM2^3 + \frac{3^2}{3}(|a|^4)(|b|^2) + \ldots\right)$$

It can be seen that as $|b|^2 \to 0$, $$IM7_{I,Q} \to \frac{105}{64}IM5_{I,Q}(IM2) \quad (9)$$

$$IM9_{I,Q} \to \frac{189}{64}IM5_{I,Q}(IM2^2)$$

$$IM11_{I,Q} \to \frac{1155}{256}IM5_{I,Q}(IM2^3)$$

which shows that the successive regeneration scheme proposed for use at IM3 frequency offsets of $2f_2-f_1$ and $2f_1-f_2$ work for higher-order frequency offsets as well.

For large $|a|$, $IM2 \approx |a|^2$ and the ratio of the leading error term to the IM2 term is given by equation (10). As in the case of the original concept, as the ratio $|b|/|a| \to 0$, then the error due to the approximation inherent in the higher-order IMD generating scheme goes to zero:

$$IM7 \quad : \frac{1^2}{3}\frac{|b|^2}{|a|^2} \quad (10)$$

$$IM9 \quad : \frac{2^2}{3}\frac{|b|^2}{|a|^2}$$

$$IM11 \quad : \frac{3^2}{3}\frac{|b|^2}{|a|^2}$$

RF/Analog Front End Architecture

Figure 21:
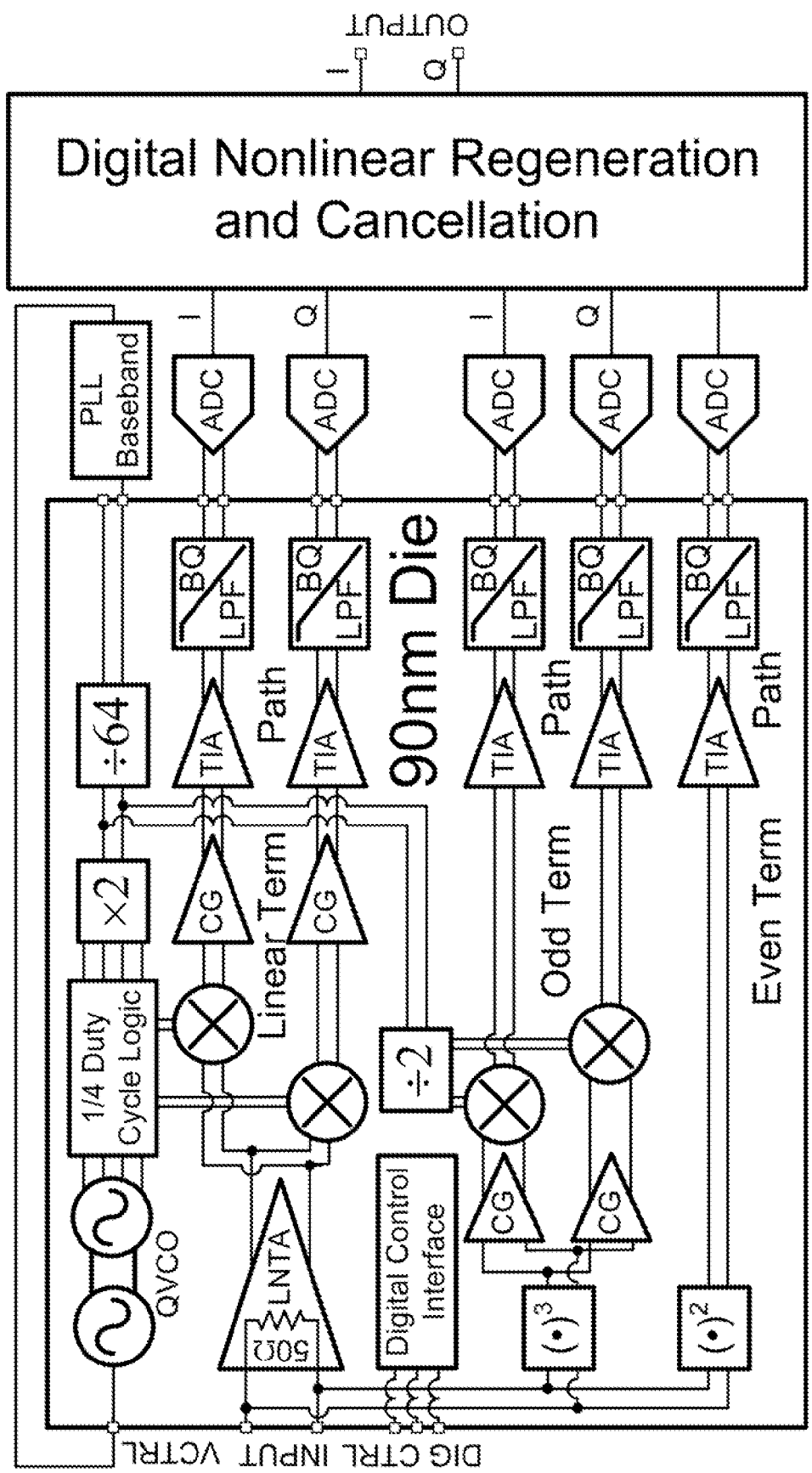
FIG. 21 shows a block diagram of the receiver architecture with more detail shown for the RF/Analog front end.

FIG. 21 shows a block diagram of the receiver architecture with detail shown for the RF/Analog front end. We use a current-domain approach for the large-signal receiver. As shown in FIG. 21, all three receiver paths access the chip input, which is the only RF node with appreciable voltage. Although the voltage at this node is somewhat distorted due to the nonlinear impedance division between the source impedance and the LNTA input impedance, the magnitude of the distortion relative to the large input blockers is small enough such that explicit nonlinear interaction between these distortion terms and the much larger blockers is negligible relative to nonlinear interaction between the blockers themselves.

To see why, consider from a quantitative perspective a peak asymmetric blocking condition of incident signals with powers of +12.5 dBm and −16.5 dBm. The IMD products at the LO frequency are about −60 dBm at the input of the receiver. Any nonlinear IMD terms generated from the interaction between this signal and the smaller blocker are at least 43.5 dB smaller in magnitude than the IMD resulting from the interaction of the smaller blocker with itself. Even if IMD cancellation greater than 40 dB is desired, the interaction of these IMD products at the LO frequency with the original blockers results in higher-order IMD terms in the nonlinear reference paths that can be canceled using the successive regeneration scheme. Hence, placement of the nonlinear reference circuitry at the input of the LNTA does not constitute a significant limitation.

Linear Path

Processing the desired signal to be received is performed by the linear path of the receiver and as such it comprises nominally linear circuit blocks. In one exemplary embodiment, the LNTA interfaces to the quadrature passive mixers in a capacitive fashion via the capacitors. Each of the four capacitors was implemented using two parallel capacitors, each of which goes to one of the two quadrature mixers. In order to isolate the I and Q downconversion chains with minimal voltage swing at the LNTA output, a ¼-phase passive mixer scheme was used. The noise generated by the transimpedance amplifier (TIA) in a passive mixer system is a well-known problem in cases such as this, where the impedance looking back up into the passive mixer is low. In order to provide a high source impedance to the TIA, it is preceded by a common-gate (CG) buffer, thereby lowering its effective noise contribution. When placed in parallel with a very large (335 pF) differential capacitor, the input impedance of the CG buffer also aids in attenuating the amount of large downconverted blocker that is passed to the remainder of the receiver chain. A second-order active RC biquad (BQ) is used to both buffer the TIA and to complete a 3rd-order Chebychev low-pass anti-aliasing filter. The biquad outputs are designed to drive the discrete ADCs through the ESD network and remain stable over process corner even when loaded with 20 pF of capacitance. The 3-dB cutoff frequency of the composite (CG-TIA-BQ) filter is approximately 2.3 MHz so as to avoid introducing substantial group delay distortion for desired signals occupying double-sided bandwidths up to 4 MHz. Coarse dc offset cancellation is provided by adding a differential static current to the virtual ground nodes of the first biquad OTAs. This allows the receiver to process large baseband IMD products even in the presence of large dc offset.

Odd Nonlinear Path

A multistage cubic term generator along with the odd nonlinear path generates the 3rd-order IMD products. The output of the cubic term generator is a current-mode signal which is buffered by CG amplifiers that provide separation between the I and Q passive mixers that downconvert the reference IM odd products to baseband. Because the IM odd reference current is small relative to the current handled by the linear path, the I/Q buffering can be done in such a way that places a large impedance in series with the signal path. In this case, a more traditional passive mixer scheme can be employed as opposed to a ¼-phase scheme that uses greater power due to the sharper rise and fall times of the mixer drive waveforms. Since the ratio between undesired IM odd products and desired IM odd products is much smaller than the ratio between the undesired blocker and the desired signal, the baseband anti-alias filtering in the nonlinear paths is less than in the linear path. Hence, a large filtering capacitor in the linear path is not used here. Similarly, the large output impedance presented by the CG buffers, even at RF, prevents the input-referred TIA noise from being substantially amplified, although care should be taken to avoid the introduction of substantial parasitic capacitance at this node. Like the linear path, 2nd-order Chebyshev filters are used to buffer the TIA and drive the discrete ADC inputs. In this case, the 1-dB and 3-dB cutoff frequencies of the filters are 6.5 MHz and 7.2 MHz, respectively, and the in-band ripple is minimized in order to create the effectively memoryless (aside from a constant group delay) analog signal path used by the successive regeneration scheme to obtain large IMD cancellation ratios for signals of large bandwidth. The larger cutoff frequency of the Chebyshev baseband filters relative to those of the linear path is made possible by the reduced amplitude discrepancy between desired and undesired signals relative to the linear path. Thus, less attenuation is needed in the anti-alias filtering than in the linear path to achieve the desired IER. Coarse dc offset cancellation circuitry is present in the nonlinear path biquads as well but were not used during testing Even Nonlinear Path Fronted by a canonical MOS squaring circuit, the even nonlinear path incorporates the same baseband building blocks as the odd nonlinear path, saving design time. Since the desired even-order (principally IM2) products already exist at baseband, there is no need for any frequency conversion.

Frequency Generation

Figure 22:
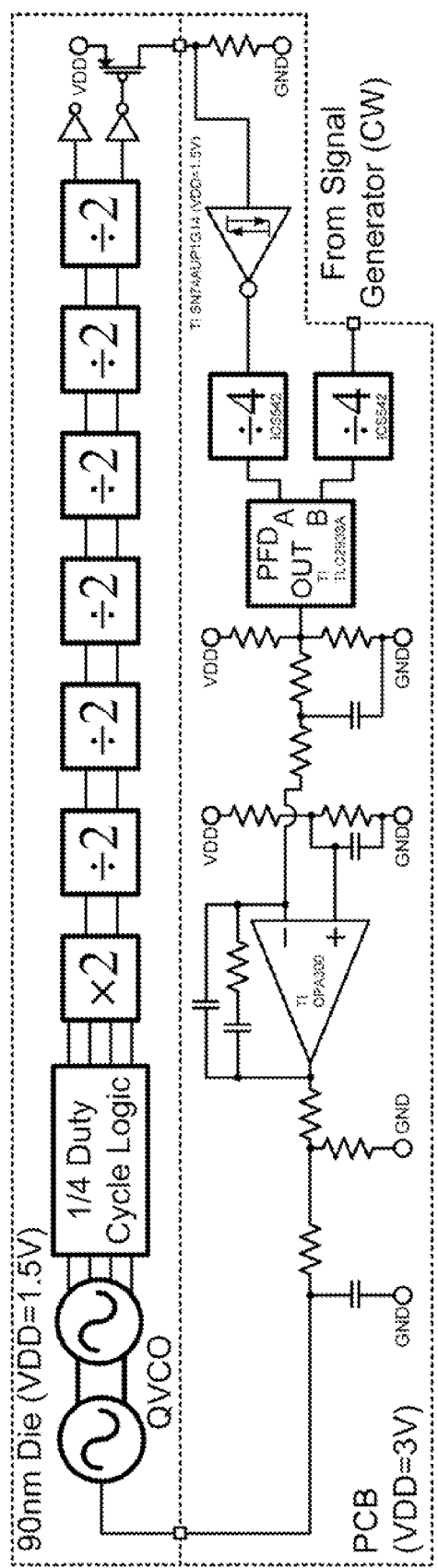
FIG. 22 shows a block diagram of a PLL loop.

FIG. 22 shows a block diagram of an exemplary PLL loop with off-chip components as was implemented in a prototype receiver. Accurately setting the reference frequency of the experimental receiver was accomplished using the PLL. Use of the PLL helped to provide reliable measurements of complex signals passing through the receiver. The purpose of this PLL is to prevent large-scale low-frequency drift of the LO frequency and to maintain the out-of-band phase noise performance of the QVCO rather than to achieve a particular in-band phase noise floor. Although the IMD products around the LO frequency can be large, the phase noise imbued onto these signals when downconverted is the same in both the linear and nonlinear paths. In principle, therefore, the in-band phase noise of the PLL does not prevent cancellation of IMD products, although it can slightly degrade the EVM of an incident desired signal.

The VCO oscillates at the LO frequency in order to minimize the out-of-band phase noise floor for a given power dissipation. Since the out-of-band phase noise floor is determined in part by the thermal noise of the devices operating at high frequencies, driven circuits such as frequency dividers contribute substantially in this frequency range unless they are of inordinate power dissipation. Not running the VCO at 2× the LO frequency is an atypical choice due to the fact that it promotes LO-RF and RF-LO coupling, increasing dc offset and decreasing IIP2, respectively. However, in this architecture, dc offset is compensated by adding a differential static current to the first OTA virtual ground in the biquads. IM2 products are ultimately cancelled using the scheme described herein, thus improving the effective IIP2 performance.

The PLL loop, shown in FIG. 22 begins off-chip with discrete frequency dividers which permit the use of low-frequency reference oscillator inputs and phase-frequency detectors. The outputs of the frequency dividers are compared using a TI TLC 2933A discrete phase frequency detector/charge pump circuit. As the charge pump of the TI TLC 2933A includes low-impedance switches to each of the power supplies, another mechanism to regulate the current flowing into the loop filter was implemented. This was done by first using a resistive voltage divider to establish a common mode voltage of $V_{DD}/2$ at the charge pump output and then by low-pass filtering the resultant perturbations in voltage produced by the charge pump switching. Secondly, the output voltage of the low-pass filter and the virtual ground node of an active loop filter were applied across a resistor to establish the current to be integrated onto the loop filter capacitor. Because the discrete PLL components operate under a supply voltage of twice that of the 90 nm RF/Analog die, a passive resistive divider is used to reduce the output of the active loop filter in order to avoid overvoltage damage to the chip. This output was then low-pass filtered in order to remove high-frequency noise on the reference line prior to re-entering the chip to act as the control voltage of the QVCO.

ADCS and Digital Interface

The analog outputs of the receiver are captured by 12-bit ADI AD9235 ADCs running at 25 MHz. The digital outputs of the ADCs are received by an FPGA platform that serializes the data so that it can be sent to a logic analyzer/vector signal analyzer for data acquisition and real-time measurement of the receiver baseline metrics.

Digital Back End Architecture

Figure 23:
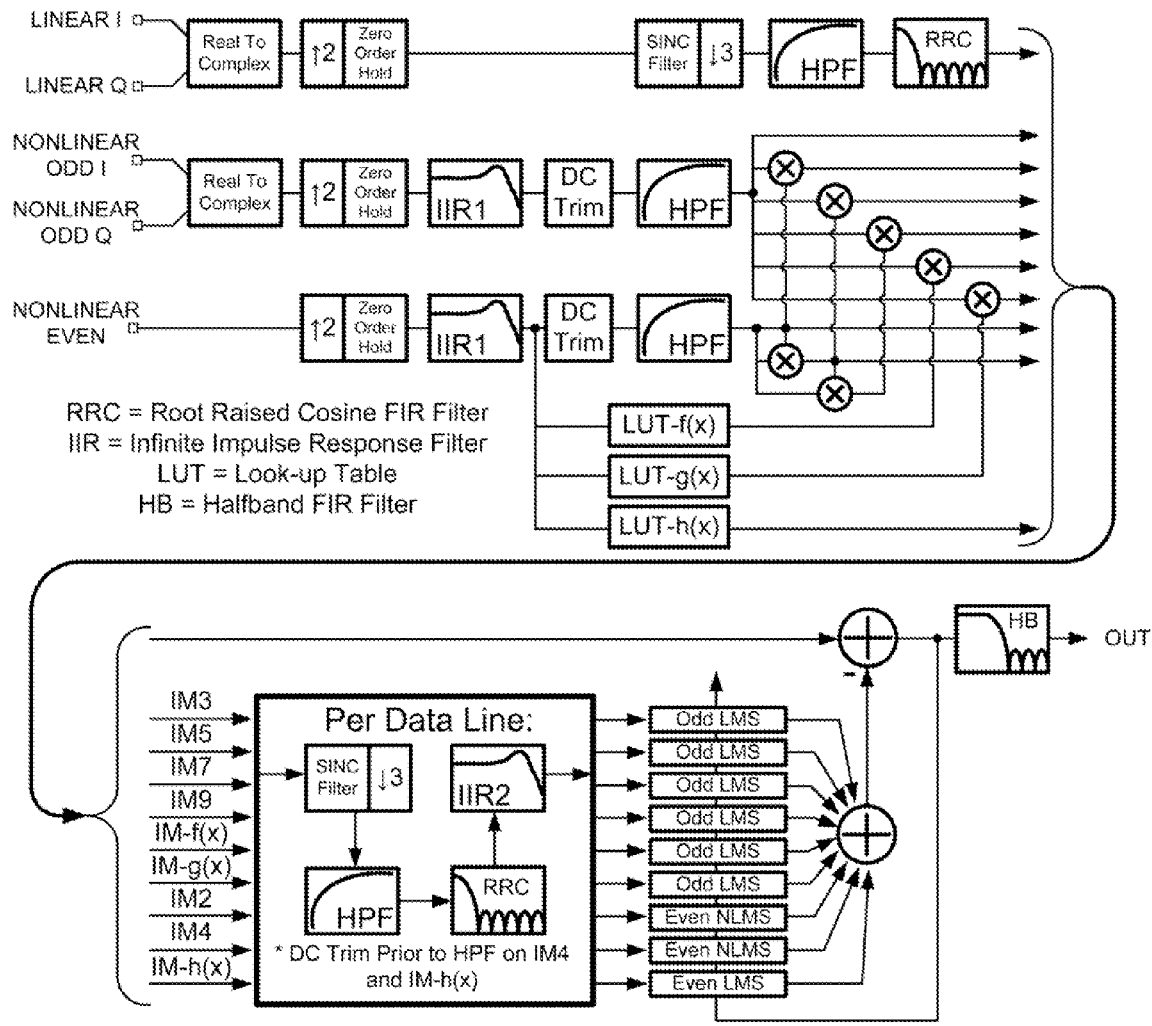
FIG. 23 shows a block diagram one embodiment of a digital back end architecture for the incompressible receiver.

FIG. 23 shows a block diagram one embodiment of a digital back end architecture for the incompressible receiver. For the proof-of-concept demonstration of the successive generation and adaptive cancellation of IMD products, the digital back end (DBE) was implemented in a fixed-point software model, with its architecture shown in FIG. 23. The nonlinear path inputs are upsampled and filtered prior to successive nonlinear reference generation to prevent unwanted higher-order nonlinear terms from aliasing into the signal band. This filtering also compensates for the small amount of group delay distortion present in the nonlinear path analog baseband filters. After this process is complete, an approximate digital model of the analog linear path baseband filter removes undesired residue from these operations and helps to better match the known difference between the frequency responses of the linear and nonlinear paths.

Figure 24:
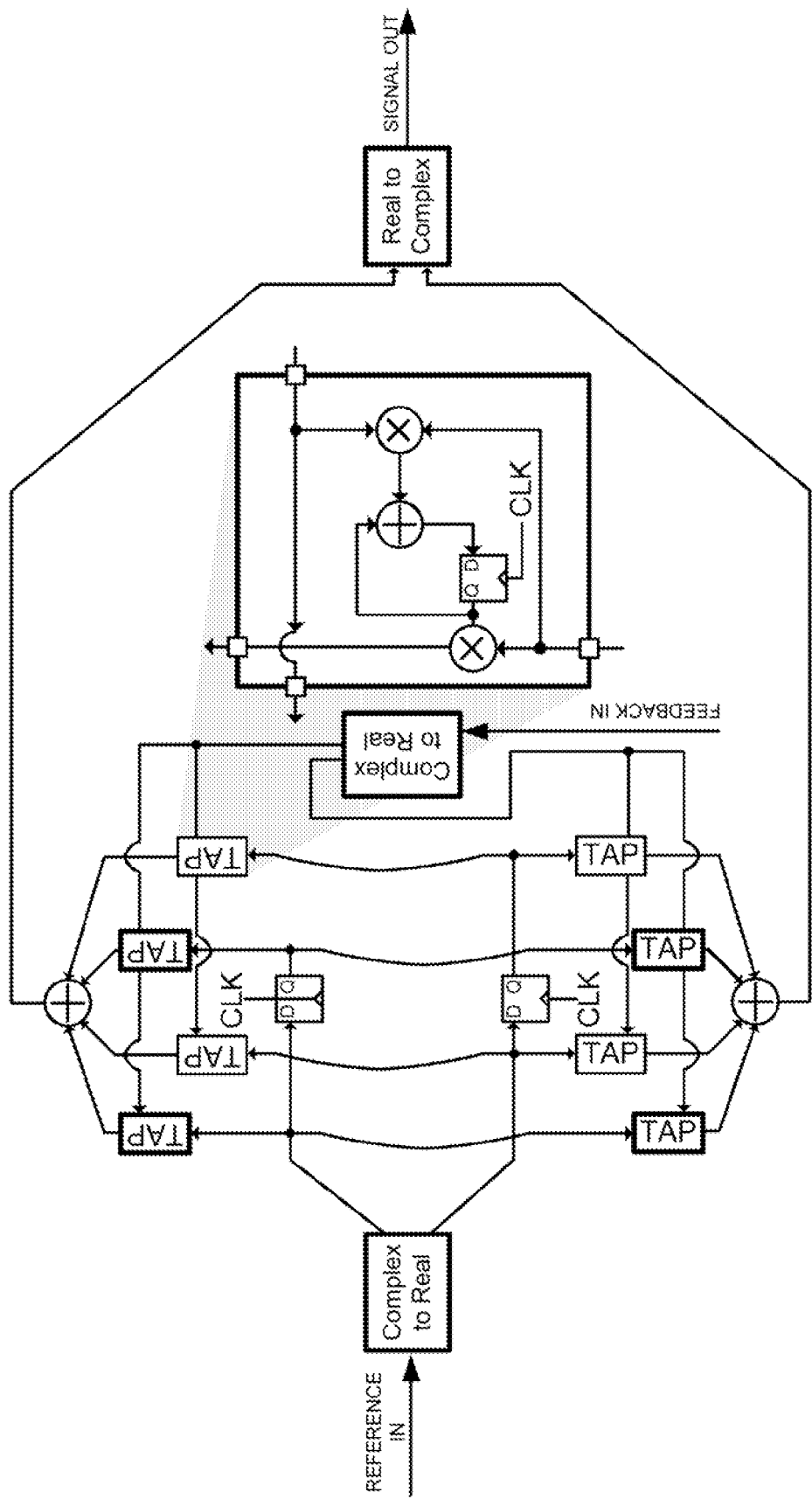
FIG. 24 shows a block diagram of a hardware implementation of one exemplary complex LMS algorithm modified to compensate for I/Q mismatch.

FIG. 24 shows a block diagram of a hardware implementation of one exemplary complex LMS algorithm modified to compensate for I/Q mismatch. The remaining frequency-domain difference between the linear and nonlinear path transfer functions was fine-tuned via LMS adaptive equalizers modified to compensate for I/Q mismatch, as shown in FIG. 24.

Figure 25:
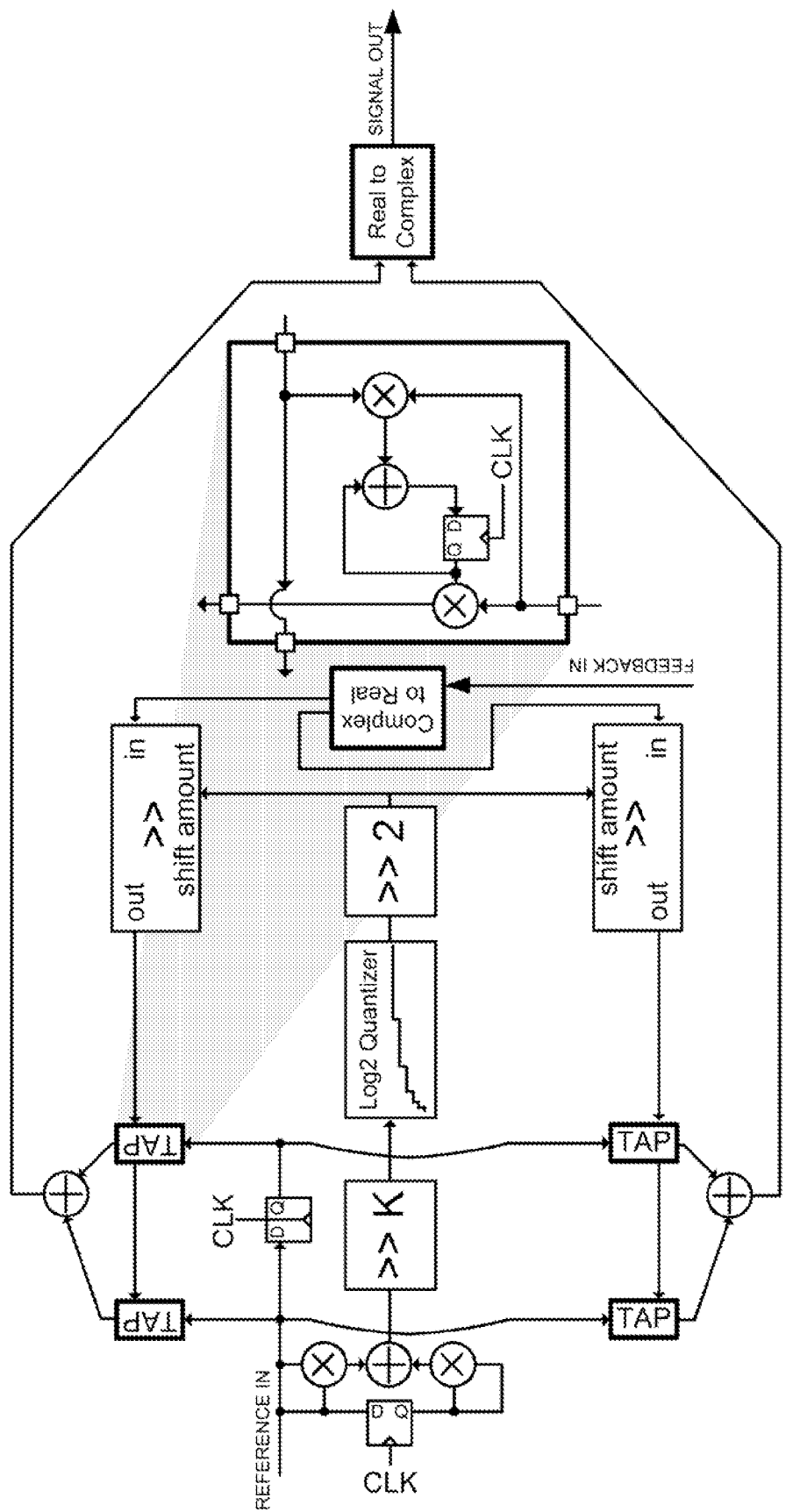
FIG. 25 shows a block diagram of an exemplary complex modified-NLMS algorithm modified to compensate for I/Q mismatch.

FIG. 25 shows a block diagram of an exemplary complex LMS algorithm modified to compensate for I/Q mismatch. Quantized-NLMS adaptive equalizers modified to divide by the square root of the norm were placed on the IM2 and IM4 lines to reduce gradient noise amplification for large signal levels. Modifying to divide by the square root of the norm was done using a bit shift, as shown in FIG. 25, and did not constitute an undue hardware burden.

High-pass filters remove dc offsets and 1/f noise from the incoming signals. Dc trimming circuits are used to cancel dc offsets prior to the high-pass filters and can be periodically turned on to measure the analog die output offsets at regular intervals when the IMD cancellation scheme is not in use. This is done so that the combination of dc offsets along with the high-pass filters do not result in large settling times during alternate path turn-on that would delay convergence of the adaptive algorithm. Dc trim circuits are also used prior to the high-pass filters on the higher-order even IMD lines, as dc signal is regenerated by even-order nonlinear operations.

Root-raised cosine filters provide a large degree of adjacent channel rejection and have a 3-dB cutoff frequency of 2.0 MHz. Large adjacent channel signals should also be removed prior to adaptive cancellation as these signals will interfere in the LMS correlation process, generating a significant amount of tap noise. These filters are used in typical communications systems in any event in order to complete a raised cosine filter (the other root-raised filter is used to pulse-shape the output data of the transmitter) so that intersymbol interference is minimized.

In some embodiments, the basis elements used by the LNTA can be implemented as the 256-element lookup tables $f(x)$ and $g(x)$ in FIG. 23. Both $f(x)$ and $g(x)$ can realize functions of the form $e^{-|k|x}$ where a squaring term is not needed due to the fact that the IM2 products have already experienced a squaring. The performance of the cancellation scheme is not extremely sensitive to the value of k used—the value of k can change ±20% without affecting input-referred cancellation more than 0.1 dB in the measured worst-case blocking condition. A function $\tanh(k \cdot x)$ is used in the even-order distortion cancellation. It was found that adding this functional basis helps to reduce the effects of low-frequency corruptive signals on the odd nonlinear path outputs during application of a large signal to the receiver input. Over short time periods, this corruptive signal appears as dc on the odd nonlinear path baseband input. When this dc signal multiplies the outputs of the f(x) and g(x) blocks, it creates yet another spurious signal which is partially canceled by the tan h(k·x) basis.

Finally, a half-band filter was added to the output of the algorithm to suppress glitching during the peak blocking condition. As the glitch impulses are composed mostly of high-frequency content, they are dramatically attenuated by the half-band filter. This glitching occurs because the IMD products in the linear path baseband occasionally rail the output of the OTAs, generating higher-order harmonics that are not well modeled by the basis set shown in FIG. 23. Although in principle a basis element can be developed to explicitly model this source of error, the half-band filter is a less multiplier-intensive solution to the problem.

The complete digital back-end circuitry used in the nonlinear path, including the adaptive equalizers, uses 39 and 342 16-bit multipliers running at 50 MHz and 16.66 MHz, respectively. Assuming that the multipliers dominate the power consumption, the extra digital circuitry and adaptive filters would consume about 12 mA and 41.5 mA under a 1.3 V supply for the even and odd nonlinear paths, respectively. In practice, these quantities would be dramatically reduced by time-averaging, as correction is only used under infrequent blocking conditions.

Operational Setup

Figure 26:
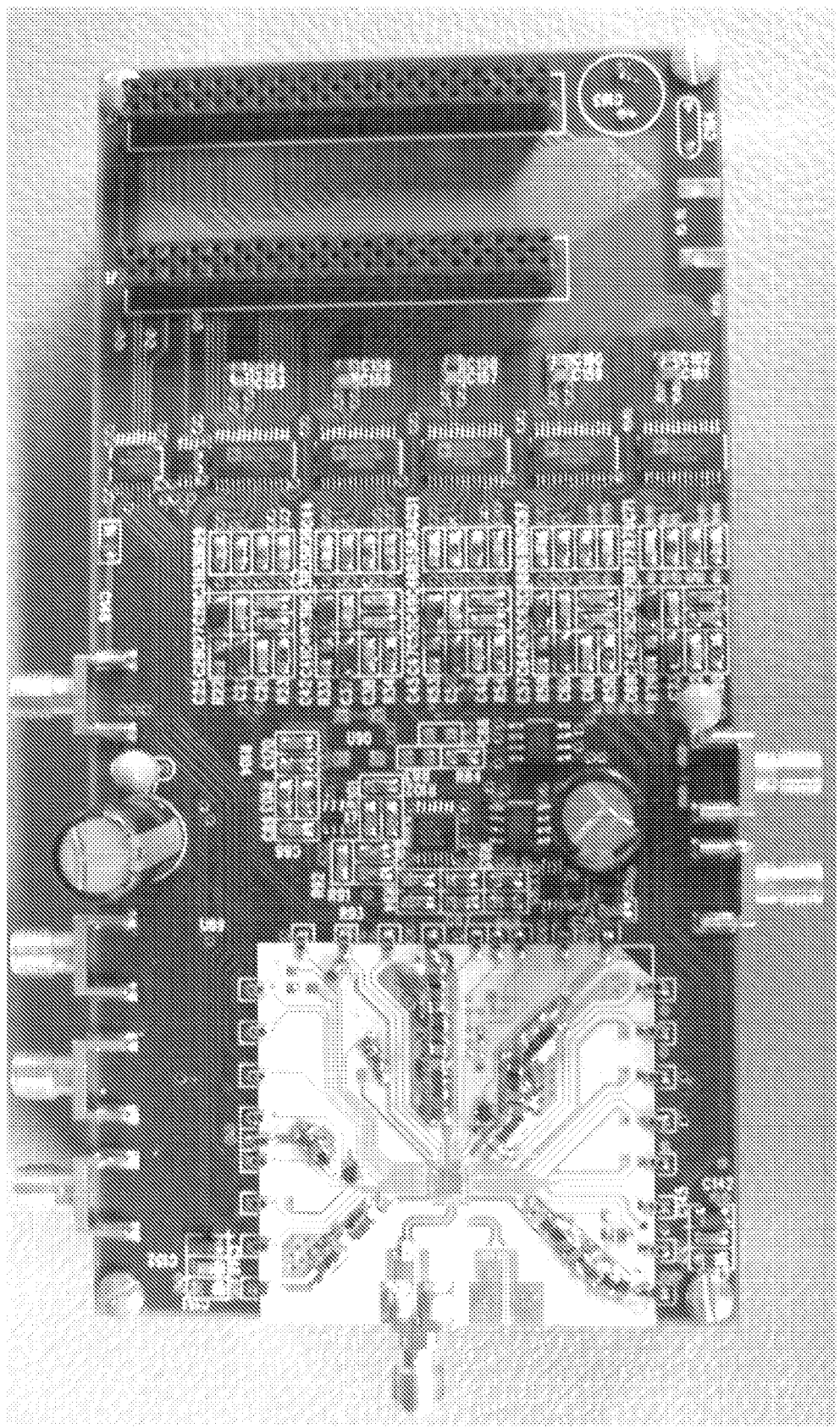
FIG. 26 shows a photograph of an exemplary assembled RF/Analog front end.
Figure 27:
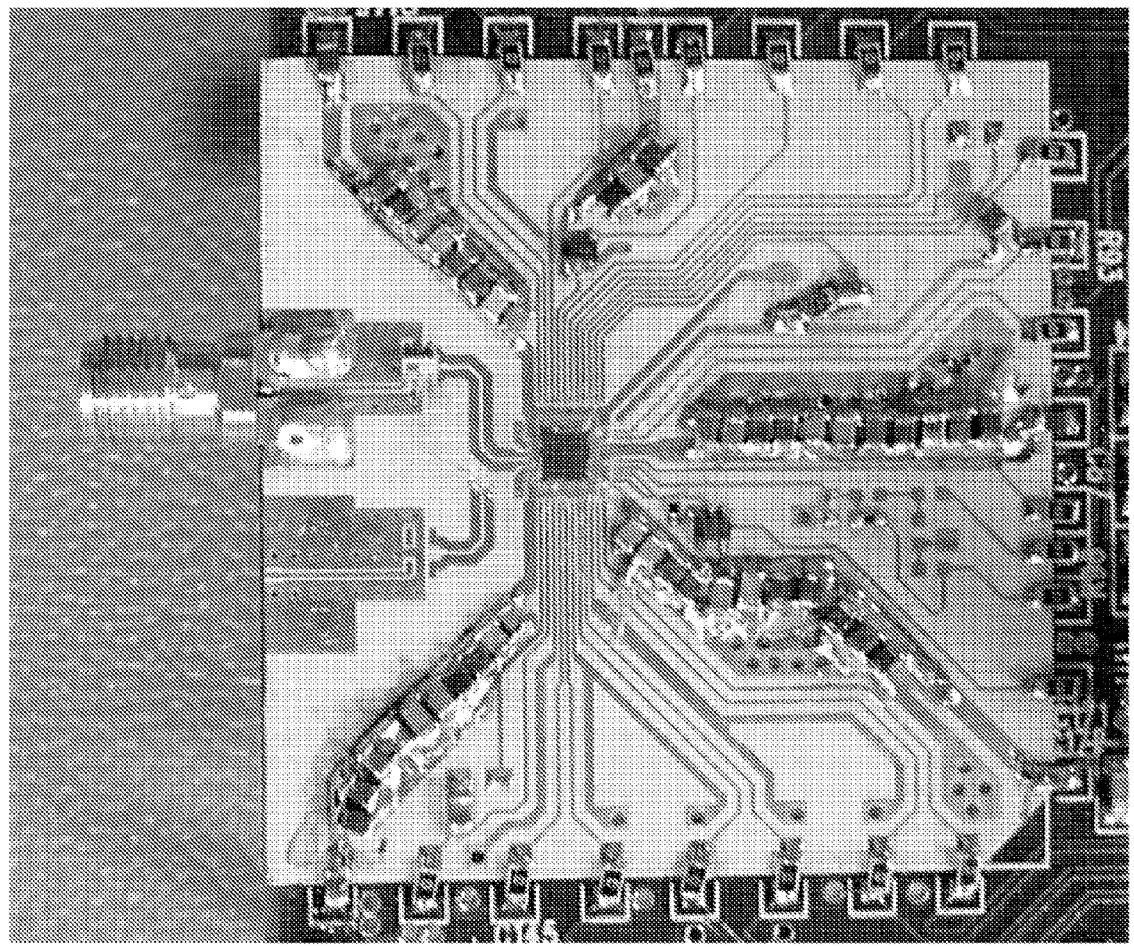
FIG. 27 shows a photograph of an exemplary mounted RF/Analog 90 nm die with RF and local baseband connections.
Figure 28:
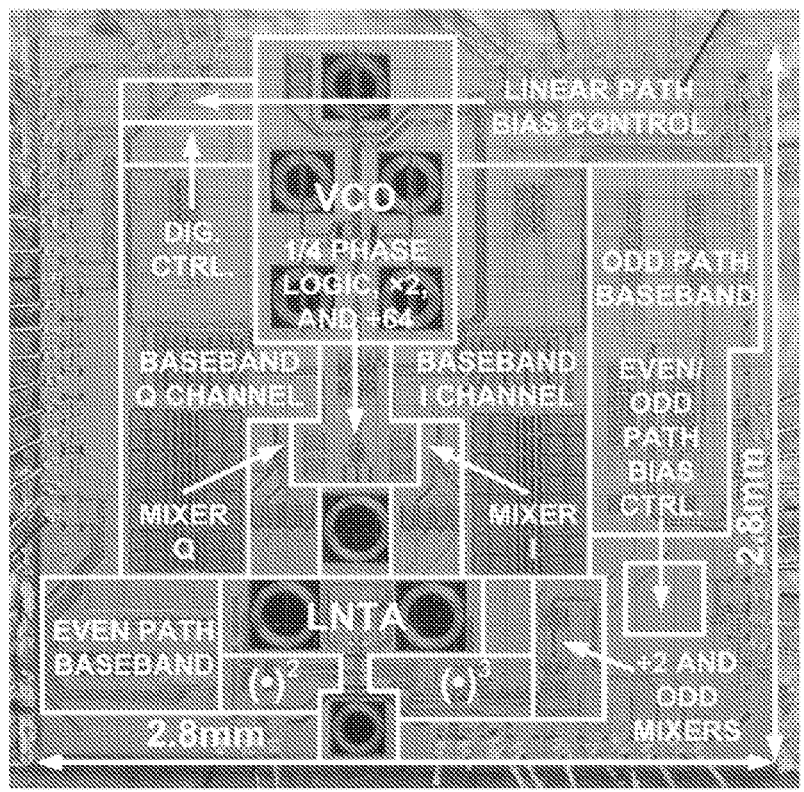
FIG. 28 shows a photograph of an exemplary RF/Analog chip die photo.

One exemplary assembled receiver (up to the ADC interface) is shown in FIG. 26. A close-up of the gold-plated Rogers board is shown in FIG. 27, and the die photo of the chip is shown in FIG. 28. Included on the Rogers board are an external 1:1 balun and ac coupling capacitors to the input of the LNTA. A balun is used to interface the differential 50Ω LNTA with the single-ended 50Ω test equipment. Calibration of the input sources is performed up to the leftmost (RF input) SMA connector of the receiver. The combined losses of the SMA connector, balun, routing, and ac coupling capacitors are taken into account by shorting the exposed terminals of the ac coupling capacitors, which sit 180 μm apart, and by measuring the $S_{11}$ scattering parameter. The result of this experiment in dB divided by two yields the combined loss of the input network up to the LNTA. As the final connection to the LNTA occurs in free space, the wavelength of a 1.9 GHz input signal at this point is 160 mm. Since the shorted connection length is 3 orders of magnitude less than the signal wavelength, this shorted connection is a very good approximation to an ideal short, validating this measurement procedure. The measured losses of this input network are then de-embedded from the raw measurement data of the receiver itself.

Figure 29:
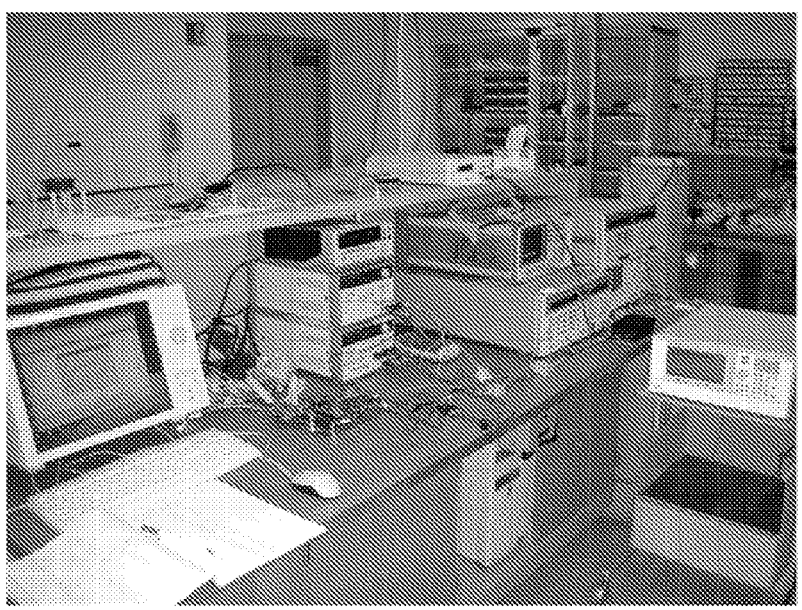
FIG. 29 shows a photograph of an exemplary experimental setup.
Figure 30:
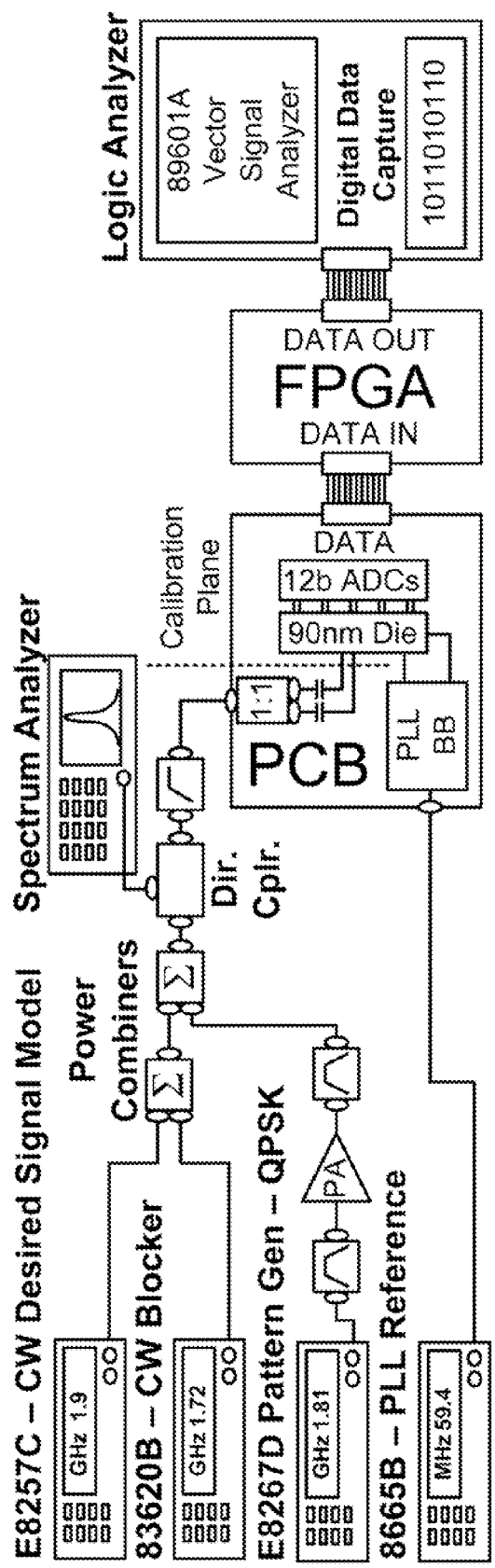
FIG. 30 shows a schematic diagram of the experimental setup of FIG. 29.

A picture of the experimental setup is shown in FIG. 29. FIG. 30 shows a schematic diagram of the experimental setup. The large modulated blocker is supped by an Agilent E8267 vector signal generator followed by three Panasonic EFCH1842TCD1 SAW filters in series in order to attenuate the signal generator phase noise at the RX LO frequency. In order to overcome subsequent losses, the large modulated signal is amplified by a Mini-Circuits ZHL-4240 power amplifier and then followed by three additional EFCH1842TCD1 SAW filters in order to remove more noise from the Agilent E8267 and the power amplifier. An Agilent E8257C signal generator is used to model a CW desired signal, while an Agilent 83620B signal generator was used to generate the smaller of the two blockers. These two signals are combined using a Mini-Circuits MC-2-2500 signal combiner/splitter. The resultant output is then combined with the output of the final large-signal SAW filters using a Mini-Circuits ZAPDQ-2 power splitter/combiner. According to the ZAPDQ-2 data sheet, its typical port isolation is 25 dB at 1.8 GHz, helping to protect the two smaller-signal generators from the power amplifier output. The output of the ZAPDQ-2 is coupled to a HP 8563E spectrum analyzer via a Krytar model 1851 directional coupler. The spectrum analyzer is used to verify that the proper signal characteristics are present in the system at any given time. The directional coupler is connected to the receiver RF input via a Mini-circuits ZFBT-6GW bias tee. Calibration of the input source network is performed by recording key signal power levels at the output of the cable connecting to the assembled receiver with a HP 8487A power sensor and an Agilent E4418B power meter. The receiver noise figure test is performed using the Y-factor method with an HP 346C noise source connected to the input of the aforementioned bias tee. In this latter test, the loss of the bias tee is measured and calibrated out of the noise figure and receiver gain measurement.

The PLL reference is applied using an HP 8665B sinusoidal signal generator to ensure good spectral purity of the reference signal in series with a Mini-Circuits ZFBT-6GW bias tee externally biased to 1.5 V (half the 3.0 V power supply of the PCB-based portion of the PLL).

The digital ADC outputs interface to the Terasic DE3 FPGA board via a GPIO-HSMC card. The FPGA supplies the ADC clock signals and acquires and multiplexes the different ADC channels to the Agilent 16901 logic analyzer which performs data acquisition and spectral measurements using an Agilent 89601A digital vector signal analyzer/spectrum analyzer. Baseline measurements of the RF/Analog portion of the receiver were made using the Agilent 89601A digital vector signal analyzer. Measurements involving large modulated blockers were made by acquiring data streams from the FPGA which were then exported to the software digital back end model for IMD cancellation.

Results

Baseline Receiver Tests

Figures 31A, 31B:
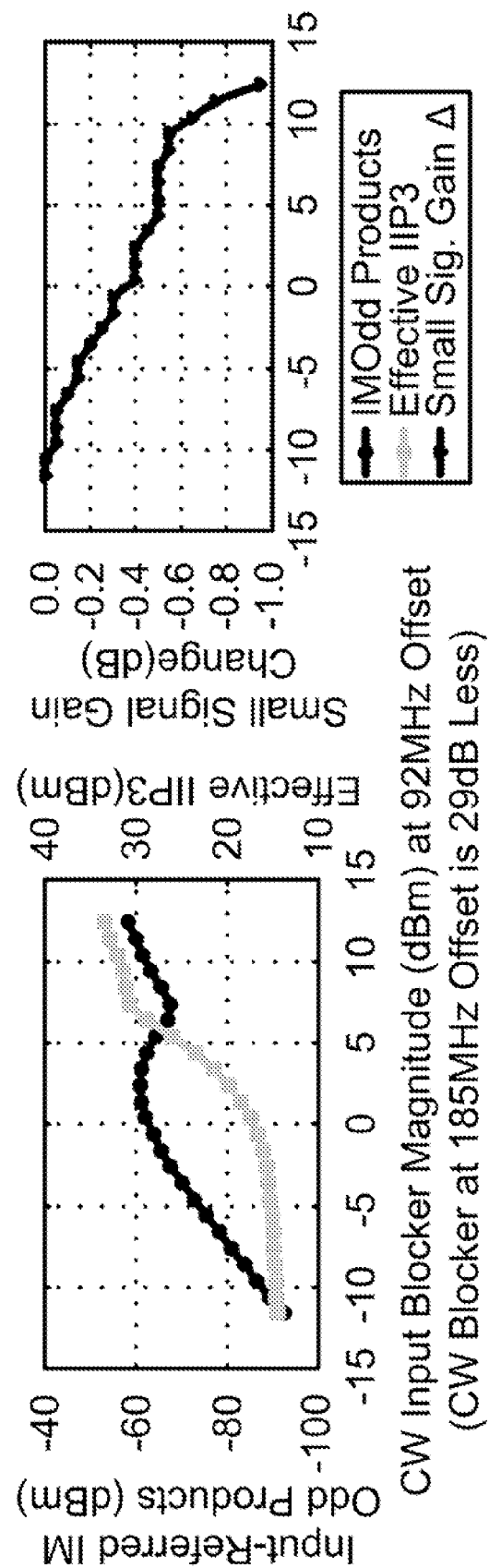
FIG. 31A FIG. 31B show graphs of Two-CW tone IIP3 test results including measured input referred error, effective IIP3, and out-of-band desensitization of a standalone RF/Analog die.

The non-monotonic nature of the LNTA nonlinearity is apparent in the results of the two-tone measurement shown in FIG. 31A and FIG. 31B. In this case, a large CW blocker at 92 MHz LO frequency offset was swept with a smaller blocker at 185 MHz offset while the LO was set to run at 1.9 GHz. The magnitude of the IM products remained roughly constant over the 0 to +12.5 dBm range. Also, the large-signal IMD products were about 40 dB less than what would be predicted if a slope-of-3 line were extended from the smaller-signal IMD products. By extrapolating at each point of the input-referred error curve of FIG. 31A and FIG. 31B, an effective IIP3 metric was obtained, reaching a peak of +33.5 dBm for a rail-to-rail blocker at the input. At the same time, the receiver small signal gain only dropped by slightly less than 1 dB for a +12.5 dBm. CW blocker input. This out-of-band 1-dB densitization point was corroborated by simulations of the LNTA loaded by both passive mixers. The performance summary of the baseline receiver is shown in FIG. 32. Notable measured results include the 50.3 dB linear path voltage gain, 10.7 dB noise figure and +64.5 dBm two-tone IIP2.

Modulated Blocker Receiver Tests

Figures 33A, 33B:
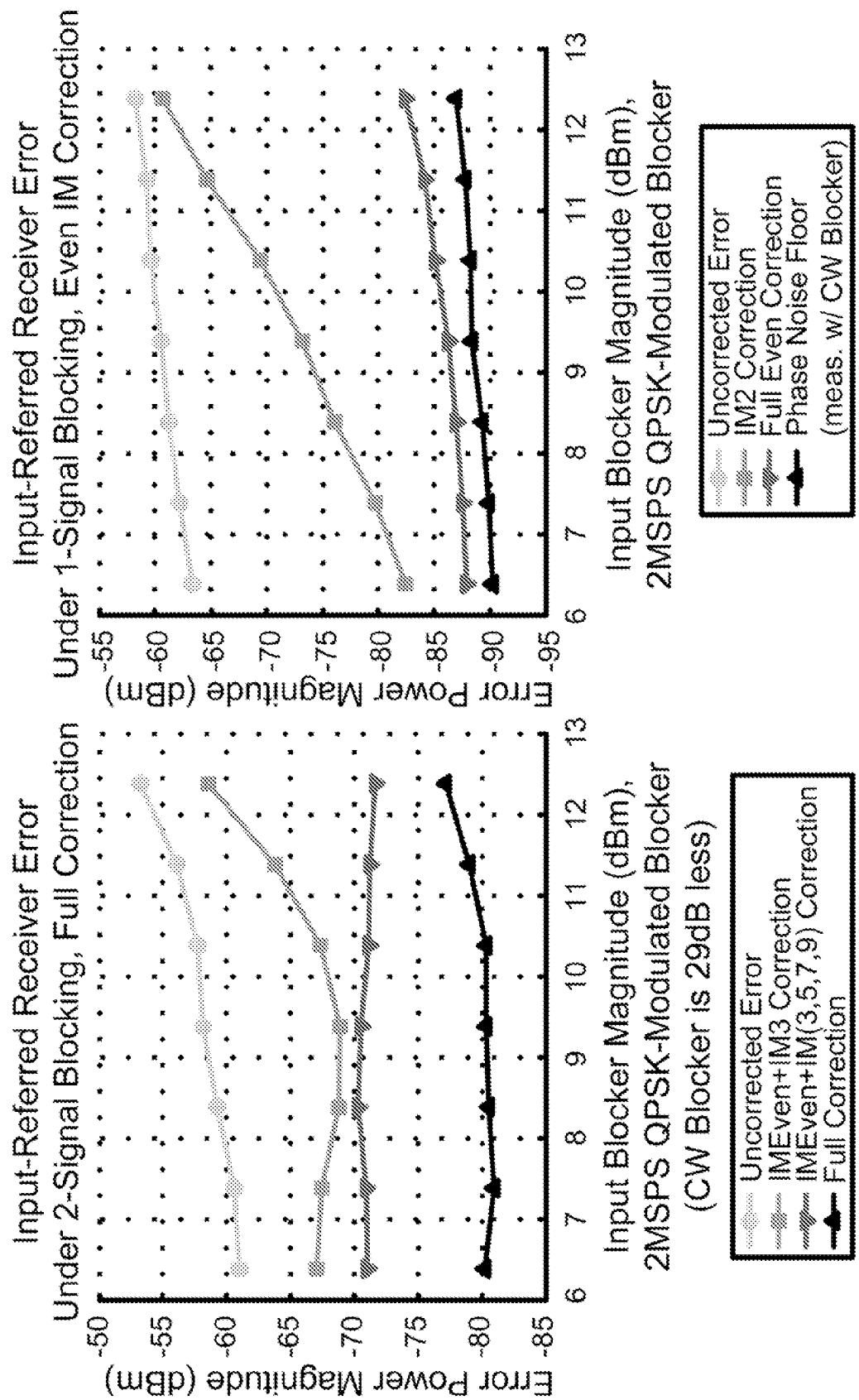
FIG. 33A shows a graph of even and odd-order cancellation for two-signal blocking.
FIG. 33B shows a graph of even-order cancellation for large QPSK-modulated blocker and phase noise floor.

FIG. 33A and FIG. 33B show graphs of measured input-referred error with various degrees of cancellation. FIG. 33A shows a graph of even and odd-order cancellation for two-signal blocking. FIG. 33B shows a graph of even-order cancellation for large QPSK-modulated blocker and phase noise floor (measured with a CW blocker).

Figures 34A, 34B:
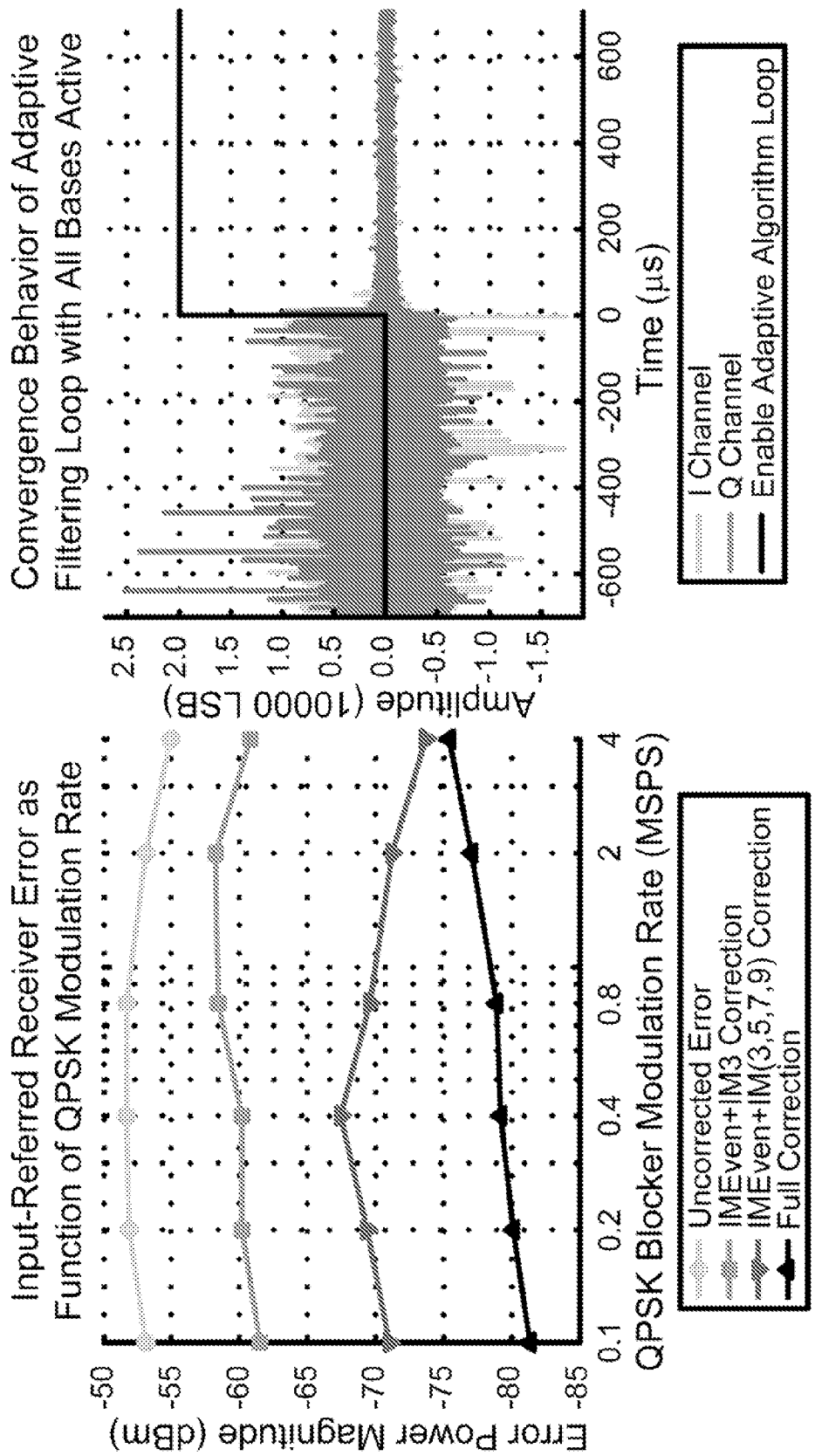
FIG. 34A shows a graph of measured input-referred error as function of modulation bandwidth.
FIG. 34B shows a graph of convergence behavior of full adaptive algorithm.

FIG. 34A shows a graph of measured input-referred error as function of modulation bandwidth for a +12.4 dBm QPSK blocker/−16.3 dBm CW blocker. FIG. 34B shows a graph of convergence behavior of full adaptive algorithm for a +11.4 dBm 2MSPS QPSK blocker/−16.3 dBm CW blocker.

The linearity performance of the receiver was tested under modulated blocking conditions by applying a large QPSK signal at a modulation rate of 2 MSPS along with a smaller CW blocker at LO offsets of 92 MHz and 184 MHz, respectively. The measured cancellation performance for different levels of applied correction is shown in the graphs of FIG. 33A and FIG. 33B. At the worst-case full-correction value, an extrapolated IIP3 metric of +45.3 dBm was obtained after de-embedding residual even-order products. The correction performance for peak blocking as a function of QPSK modulation bandwidth is shown in FIG. 34A and FIG. 34B, where the convergence behavior of the adaptive algorithm is shown in FIG. 34B. The convergence behavior shown in FIG. 34B is representative of the convergence of the adaptive algorithm and not the settling behavior of the high-pass filters. As these tests were designed to predict the sensitivity of the receiver in a modern spread-spectrum communications system in which the magnitude of the desired signal at sensitivity is below that of the error floor, the RX signal model was not applied during the determination of the output-referred error. In order to input-reference the error, the modulated blocking tests were re-run in the presence of −66 dBm and −86 dBm CW desired signal models in order to determine small signal gain changes of the system under the conditions for the top two curves in FIG. 33A, FIG. 33B, FIG. 34A, FIG. 34B with the bottom curves representing modulated tests.

Although the theoretical description given herein is thought to be correct, the operation of the devices described and claimed herein does not depend upon the accuracy or validity of the theoretical description. That is, later theoretical developments that can explain the observed results on a basis different from the theory presented herein will not detract from the inventions described herein.

While the present invention has been particularly shown and described with reference to the preferred mode as illustrated in the drawing, it will be understood by one skilled in the art that various changes in detail can be affected therein without departing from the spirit and scope of the invention as defined by the claims.

What is claimed is:

1. An incompressible receiver for minimizing undesired higher-order nonlinear distortion products comprising:
a first receiver path having a first receiver path input configured to receive an input signal having at least one non-baseband frequency, and at least one first receiver path output configured to provide a first path output signal having at least one baseband (BB) frequency, said first receiver path comprising at least one mixer, said at least one mixer having a first input terminal electrically coupled to a local oscillator configured to provide a local oscillator signal and having a second input terminal electrically coupled to said first path input and having a mixer output terminal electrically coupled to said at least one first receiver path output, said mixer configured to perform a frequency conversion, said first receiver path output signal comprising a higher-order nonlinear distortion component;
at least a second receiver path having a second receiver path input configured to receive an input signal having at least one non-baseband frequency, and a second receiver path output terminal configured to provide a second receiver path output signal, said second receiver path comprising an odd path including at least one odd-order nonlinear distortion reference component and an even path including at least one even-order nonlinear distortion reference component, each of said at least one odd-order nonlinear distortion reference component and at least one even-order nonlinear distortion reference component being configured to be in an "on" state or in an "off" state independent of any other of said at least one odd-order nonlinear distortion reference component and at least one even-order nonlinear distortion reference component, and at least one mixer configured to combine an even-order reference signal and an odd order reference signal as said second receiver path output signal; and
a combining element configured to receive as input said output signal from said first receiver path output terminal and configured to receive as input said output signal from said second receiver path output terminal and configured to combine said input signals such that the higher-order nonlinear distortion signals are substantially attenuated at an output of said combining element.

2. The incompressible receiver of claim 1 wherein said at least one odd-order nonlinear distortion reference component of said second receiver path comprises a mixer having a first input electrically coupled to an odd-order nonlinear distortion reference generator and a second input electrically coupled to said local oscillator and an output of said mixer electrically coupled to an input terminal of an odd path function block, said odd-order nonlinear distortion reference generator having as input said second receiver path input and an output of said odd-order nonlinear distortion reference component electrically coupled to said combining element.

3. The incompressible receiver of claim 1 wherein said at least one even-order nonlinear distortion reference component of said second receiver path comprises an even-order nonlinear distortion reference generator electrically coupled to an input terminal of an even path function block, said even-order nonlinear distortion reference generator having as input said second receiver path input and an output of said even-order nonlinear distortion reference component electrically coupled to said combining element.

4. The incompressible receiver of claim 3, wherein at least one of a selected one of said even path function block and an odd path function block comprises a mathematical function.

5. The incompressible receiver of claim 4, wherein said mathematical function comprises a software algorithm configured to perform said mathematical function when operating on a computation device.

6. The incompressible receiver of claim 4, wherein said mathematical function comprises a digital circuit configured to perform said mathematical function.

7. The incompressible receiver of claim 1, further comprising within said second receiver path at least one adaptive filter disposed between at least one of a selected one of an even order correction signal and an odd order correction signal and said second receiver path output.

8. The incompressible receiver of claim 1, wherein said odd-order nonlinear distortion reference generator includes both a cubic term and at least one additional term of order greater than 3.

9. The incompressible receiver of claim 1, further comprising a low noise transconductance amplifier (LNTA) disposed between said input signal and a common signal path coupled to said first receiver path input and said second receiver path input.

10. The incompressible receiver of claim 1, wherein at least one of a selected one of an even path function block and an odd order path function block comprises a look-up table.

11. The incompressible receiver of claim 1, wherein said incompressible receiver comprises a monolithic integrated circuit.

12. The incompressible receiver of claim 1, wherein said monolithic integrated circuit comprises a CMOS monolithic integrated circuit.

13. The incompressible receiver of claim 1, wherein said incompressible receiver comprises a component in a frequency division duplex (FDD) receiver-transmitter.

14. The incompressible receiver of claim 1, wherein said incompressible receiver comprises a component in an apparatus having wireless power transfer.

15. The incompressible receiver of claim 1, wherein said incompressible receiver comprises a component of a countermeasures apparatus.

16. The incompressible receiver of claim 1, further comprising an adaptive filter disposed between said higher-order term mixer and said combining element.

17. The incompressible receiver of claim 1, further including a complex LMS algorithm modified to compensate for I/Q mismatch.

18. The incompressible receiver of claim 1, further including a complex modified-NLMS algorithm modified to compensate for I/Q mismatch.

19. The incompressible receiver of claim 1, wherein a selected one of an even path function block and an odd path function block comprises a function of the form $e^{-|k||x|}$.

20. The incompressible receiver of claim 1, wherein an even path function block comprises a function of the form $\tan h(k \cdot x)$.

21. The incompressible receiver of claim 1, wherein a selected one of an even path function block and an odd path function block comprises a discrete time function.

22. The incompressible receiver of claim 1, wherein said at least one mixer configured to combine an even-order reference signal and an odd-order reference signal is a digital multiplier.

23. An incompressible receiver for minimizing undesired odd-order nonlinear distortion products comprising:

a first receiver path having a first path input configured to receive an input signal having at least one non-baseband frequency, and at least one first receiver path output configured to provide a first receiver path output signal having at least one baseband (BB) frequency, said first receiver path comprising at least one mixer, said at least one mixer having a first input terminal electrically coupled to a local oscillator configured to provide a local oscillator signal and having a second input terminal electrically coupled to said first receiver path input and having a mixer output terminal electrically coupled to said at least one first receiver path output, said mixer configured to perform a frequency conversion, said first receiver path output signal comprising an odd-order nonlinear distortion component;

at least one second receiver path having a second receiver path input configured to receive an input signal having at least one non-baseband frequency, and a second receiver path output terminal configured to provide a second receiver path output signal, said second receiver path comprising at least one odd-order nonlinear distortion reference generator having an output terminal, said odd-order nonlinear distortion reference generator including a cubic term and at least one additional term of order greater than 3, said second receiver path comprising at least one mixer, each of said at least one mixer having a first input terminal electrically coupled to a local oscillator configured to provide a local oscillator signal and having a second input terminal electrically coupled to said at least one odd-order nonlinear distortion reference generator output terminal and having a mixer output terminal electrically coupled to said at least one second receiver path output, said at least one odd-order nonlinear distortion reference generator and said mixer configured to generate a synthetic odd-order nonlinear distortion signal as output that is substantially similar to said odd-order nonlinear distortion component that appears at said first receiver path output terminal; and a combining element configured to receive said output signal from said first receiver path output terminal and configured to receive said output signal from said second receiver path output terminal and configured to combine said input signals such that the odd-order nonlinear distortion signals are substantially attenuated at an output of said combining element.

24. An incompressible receiver front end amplifier (IRFEA) comprising:

a positive array of inverters having a positive array positive input terminal and a positive array positive output terminal, each inverter of said array of inverters having a different threshold voltage;

a negative array of inverters having a negative array positive input terminal and a positive output terminal, each inverter of said array of inverters having a different threshold voltage;

a LNTA having a LNTA positive input terminal, a LNTA negative input terminal, a LNTA positive output terminal, and a LNTA negative output terminal, and;

said LNTA positive input terminal electrically coupled to said positive array positive input terminal at a IRFEA positive input terminal, said LNTA negative input terminal electrically coupled to said negative array positive input terminal at a IRFEA negative input terminal, said LNTA positive output terminal electrically coupled to said positive array positive output terminal at a IRFEA positive output terminal, and said LNTA negative output terminal electrically coupled to said negative array positive output terminal at a IRFEA negative output terminal.

* * * * *

UNITED STATES PATENT AND TRADEMARK OFFICE
CERTIFICATE OF CORRECTION

PATENT NO. : 8,233,871 B2  Page 1 of 1
APPLICATION NO. : 12/817109
DATED : July 31, 2012
INVENTOR(S) : Edward Keehr and Seyed Ali Hajimiri It is certified that error appears in the above-identified patent and that said Letters Patent is hereby corrected as shown below:

The STATEMENT REGARDING FEDERALLY FUNDED RESEARCH OR DEVELOPMENT appearing at column 1, lines 45-47 is deleted and is replaced with:

This invention was made with government support under Grant No. FA8650-09-C-7924 awarded by Air Force Office of Scientific Research. The government has certain rights in the invention.

Signed and Sealed this
Twenty-fifth Day of September, 2012

David J. Kappos
*Director of the United States Patent and Trademark Office*